(12) United States Patent
Herrmann et al.

(10) Patent No.: US 12,403,832 B2
(45) Date of Patent: *Sep. 2, 2025

(54) LIGHT EMITTING MIRROR BEZEL

(71) Applicant: Motherson Innovations Company Limited, London (GB)

(72) Inventors: Andreas Herrmann, Stuttgart (DE); Andrew Lettis, Portchester (GB); Callum Scott-Collins, Portchester (GB); Gary Smith, Portchester (GB); Graham Rehill, Portchester (GB); Andrew Brian Little, Portchester (GB); Ian Robert Toone, Portchester (GB)

(73) Assignee: Motherson Innovations Company Limited, London (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/809,637

(22) Filed: Aug. 20, 2024

(65) Prior Publication Data

US 2024/0409031 A1     Dec. 12, 2024

Related U.S. Application Data

(63) Continuation of application No. 18/485,365, filed on Oct. 12, 2023, now Pat. No. 12,090,927, which is a (Continued)

(30) Foreign Application Priority Data

Jan. 24, 2012   (AU) ................................ 2012900267
Sep. 11, 2012   (DE) ......................... 102012108480.7

(Continued)

(51) Int. Cl.
*B60R 1/12*     (2006.01)
*B60Q 1/26*    (2006.01)
*B60R 1/06*     (2006.01)

(52) U.S. Cl.
CPC .......... *B60R 1/1207* (2013.01); *B60Q 1/2665* (2013.01); *B60R 1/06* (2013.01)

(58) Field of Classification Search
CPC ........... B60R 1/1207; B60R 1/06; B60R 1/12; B60R 2001/1223; B60Q 1/2665;
(Continued)

(56) References Cited

U.S. PATENT DOCUMENTS 8,550,675 B2   10/2013   Fehn et al.
11,603,044 B2   3/2023   Hermann et al.
(Continued)

FOREIGN PATENT DOCUMENTS

CN        1871147      11/2006
CN      101791966       8/2010
(Continued)

OTHER PUBLICATIONS

International Search Report dated May 9, 2018 of International application No. PCT/EP2018/056299.
(Continued)

*Primary Examiner* — James R Greece
*Assistant Examiner* — Jose M Diaz
(74) *Attorney, Agent, or Firm* — Jones Day

(57) ABSTRACT

An external rearview device for a vehicle includes a rearview element comprising at least one of a reflective element, a camera, or a display element; a housing configured to be attached to the vehicle and configured to be moveable relative to the vehicle; and a bezel affixed to an opening defined by the housing and surrounding the rearview element. The bezel is coated and a coating of the bezel is at least one of a decorative coating, an advanced surface technology, or a spectrally controlling system, and the rearview element is coupled to at least one of the bezel or the housing.

32 Claims, 7 Drawing Sheets

Related U.S. Application Data continuation of application No. 18/166,749, filed on Feb. 9, 2023, now Pat. No. 11,878,629, which is a continuation of application No. 17/672,436, filed on Feb. 15, 2022, now Pat. No. 11,603,044, which is a continuation of application No. 16/993,635, filed on Aug. 14, 2020, now Pat. No. 11,273,766, which is a continuation of application No. 16/569,270, filed on Sep. 12, 2019, now Pat. No. 10,766,423, which is a continuation of application No. PCT/EP2018/056299, filed on Mar. 13, 2018, said application No. 16/993,635 is a continuation-in-part of application No. 16/273,664, filed on Feb. 12, 2019, now Pat. No. 10,723,293, which is a continuation-in-part of application No. 15/256,532, filed on Sep. 3, 2016, now Pat. No. 10,202,079, said application No. 16/993,635 is a continuation-in-part of application No. 15/256,540, filed on Sep. 3, 2016, now Pat. No. 10,836,320, and a continuation-in-part of application No. 16/180,857, filed on Nov. 5, 2018, now Pat. No. 11,325,534, which is a continuation-in-part of application No. 15/922,366, filed on Mar. 15, 2018, now Pat. No. 10,661,714, which is a continuation-in-part of application No. 15/800,413, filed on Nov. 1, 2017, now abandoned, which is a continuation-in-part of application No. 15/603,751, filed on May 24, 2017, now Pat. No. 10,759,345, said application No. 16/993,635 is a continuation-in-part of application No. 15/533,118, filed as application No. PCT/IB2015/059419 on Dec. 7, 2015, now Pat. No. 10,457,345, said application No. 16/993,635 is a continuation-in-part of application No. 15/607,894, filed on May 30, 2017, now Pat. No. 10,744,947, which is a continuation-in-part of application No. 15/000,754, filed on Jan. 19, 2016, now Pat. No. 9,796,333, which is a continuation-in-part of application No. 14/022,896, filed on Sep. 10, 2013, now abandoned, said application No. 16/993,635 is a continuation-in-part of application No. 15/439,188, filed on Feb. 22, 2017, now Pat. No. 10,703,281, which is a continuation-in-part of application No. 14/936,024, filed on Nov. 9, 2015, now Pat. No. 9,656,601, which is a continuation-in-part of application No. 14/374,376, filed as application No. PCT/AU2013/000047 on Jan. 24, 2013, now Pat. No. 9,181,616.

(60) Provisional application No. 62/470,658, filed on Mar. 13, 2017.

(30) Foreign Application Priority Data

| | | | |
|---|---|---|---|
| Dec. 5, 2014 | (EP) | ...................................... | 14196582 |
| Apr. 8, 2015 | (EP) | ...................................... | 15162850 |
| Sep. 3, 2015 | (EP) | ...................................... | 15183748 |
| Sep. 3, 2015 | (EP) | ...................................... | 15183758 |
| Nov. 14, 2016 | (EP) | ...................................... | 16198759 |

(58) Field of Classification Search
CPC .......... H05K 2201/09263; H05K 2201/10106; H05K 2201/10189; H05K 2201/0999; H05K 1/189; H05K 1/0284; H05K 3/0014; H05K 3/101; H05K 3/105

See application file for complete search history.

(56) References Cited

U.S. PATENT DOCUMENTS

| | | | |
|---|---|---|---|
| 12,090,927 B2 * | 9/2024 | Herrmann | .............. H05K 1/189 |
| 2005/0276058 A1 | 12/2005 | Romas et al. | |
| 2007/0019426 A1 | 1/2007 | Uken | |
| 2008/0112176 A1 | 5/2008 | Liesener | |
| 2010/0177523 A1 | 7/2010 | Bisnack | |
| 2013/0003405 A1 | 1/2013 | Fehn et al. | |

FOREIGN PATENT DOCUMENTS

| | | |
|---|---|---|
| CN | 104302803 | 1/2015 |
| CN | 106457753 | 2/2017 |
| DE | 202016102024 U1 | 7/2016 |
| EP | 0967118 A2 | 12/1999 |
| EP | 1598237 A1 | 11/2005 |
| EP | 2151350 A1 | 2/2010 |

OTHER PUBLICATIONS

Written Opinion dated May 9, 2018 of International application No. PCT/EP2018/056299.
CNIPA, Appl. 2023102226637, Office Action, Nov. 13, 2024.

* cited by examiner

Section Cut A-A

LIGHT EMITTING MIRROR BEZEL

CROSS-REFERENCE TO RELATED APPLICATIONS

This application is a continuation of U.S. patent application Ser. No. 18/485,365, filed on Oct. 12, 2023, which is a continuation of U.S. patent application Ser. No. 18/166,749, filed on Feb. 9, 2023, which is a continuation U.S. patent application Ser. No. 17/672,436, filed Feb. 15, 2022, which is a continuation of U.S. patent application Ser. No. 16/993,635, filed Aug. 14, 2020.

U.S. patent application Ser. No. 16/993,635 is a continuation of U.S. patent application Ser. No. 16/569,270, filed Sep. 12, 2019, which is a continuation of International Patent Application No. PCT/EP2018/056299, filed Mar. 13, 2018, which claims the benefit of priority to U.S. Provisional Patent Application No. 62/470,658, filed Mar. 13, 2017.

U.S. patent application Ser. No. 16/993,635 is also a continuation-in-part of U.S. patent application Ser. No. 16/273,664, filed Feb. 12, 2019, which is a continuation-in-part of U.S. patent application Ser. No. 15/256,532, filed Sep. 3, 2016, which claims the benefit of foreign priority to European Patent Application No. 15183748.1, filed Sep. 3, 2015.

U.S. patent application Ser. No. 16/993,635 is also a continuation-in-part of U.S. patent application Ser. No. 15/256,540, filed Sep. 3, 2016, which claims the benefit of foreign priority to European Patent Application No. 15183758.0, filed Sep. 3, 2015.

U.S. patent application Ser. No. 16/993,635 is also a continuation-in-part of U.S. patent application Ser. No. 16/180,857, filed Nov. 5, 2018, which is a continuation-in-part of U.S. patent application Ser. No. 15/922,366, filed Mar. 15, 2018, which is a continuation-in-part of U.S. patent application Ser. No. 15/800,413, filed Nov. 1, 2017, which is a continuation-in-part of U.S. patent application Ser. No. 15/603,751, filed May 24, 2017, which claims the benefit of foreign priority to European Patent Application No. 16198759.9, filed Nov. 14, 2016.

U.S. patent application Ser. No. 16/993,635 is also a continuation-in-part of U.S. patent application Ser. No. 15/533,118, filed Jun. 5, 2017, which is a national stage entry of International Patent Application No. PCT/IB2015/059419, filed Jun. 9, 2016, which claims the benefit of foreign priority to European Patent Application No. 14196582, filed Dec. 5, 2014, as well as European Patent Application No. 15162850, filed Apr. 8, 2015.

U.S. patent application Ser. No. 16/993,635 is also a continuation-in-part of U.S. patent application Ser. No. 15/607,894, filed May 30, 2017, which is a continuation-in-part of U.S. patent application Ser. No. 15/000,754, filed Jan. 19, 2016 and now issued as U.S. Pat. No. 9,796,333, which is a continuation-in-part of U.S. patent application Ser. No. 14/022,896, filed Sep. 10, 2013, which claims the benefit of foreign priority to German Patent Application No. 102012108480.7, filed Sep. 11, 2012.

U.S. patent application Ser. No. 16/993,635 is also a continuation-in-part of U.S. patent application Ser. No. 15/439,188, filed Feb. 22, 2017, which is a continuation-in-part of U.S. patent application Ser. No. 14/936,024, filed Nov. 9, 2015 and now issued as U.S. Pat. No. 9,656,601, which is a continuation-in-part of U.S. patent application Ser. No. 14/374,376, filed Jul. 24, 2014 and now issued as U.S. Pat. No. 9,181,616, which is a national stage entry of International Patent Application No. PCT/AU2013/000047, filed Jan. 24, 2013, which claims the benefit of foreign priority to Australian Patent Application No. 2012900267, filed Jan. 24, 2012.

Each of the above priority applications are hereby incorporated by reference in their entirety for all purposes.

BACKGROUND OF THE INVENTION

1. Field of the Invention

The following description relates to vehicle rearview devices, For example, such rearview devices may include a bezel which can be illuminated to provide different functions to the driver or other persons viewing the bezel.

2. Related Art

Exterior rearview devices of vehicles incorporating light sources are well known in the state of the art. Typically, a flashing direction indicator is installed for increased safety and enhanced design, as for example described in U.S. Pat. No. 7,600,905 or EP Patent No. 2 340 967.

Also, warning indicators and other light sources have been integrated into the housing, bezel and behind the rearview element to function as a turn signal, break signal or blind spot indicator. Such light sources are described in EP Patent No. 2 151 350, EP Patent No. 2 463 152, EP Patent No. 2 463 153, U.S. Pat. Nos. 7,674,025, 8,164,482. Warning indicators using optical fibers have also been used in an external rearview device in U.S. Pat. No. 7,954,985. Additionally exterior rearview devices can be equipped with video displays and display devices and have also been used as indicators, for example in U.S. Pat. Nos. 7,777,611 and 7,581,859.

Lighting systems illuminating the ground and the area around the door to increase the security of the vehicle occupants have been incorporated into external rearview devices and are well known, such as described by U.S. Pat. No. 6,149,287.

An interior rearview device is known from EP Patent No. 2 106 970 to provide ambient light originating from behind the reflective part of the rearview element. This configuration provides a bezel-less design to minimize the needed space and fulfill certain design criteria for enhancing the appearance to the driver.

For all these purposes, different type of light sources and guides have been identified to meet the demand for high brightness, low power consumption and the case and flexibility of installing them, some of which are described in EP Patent No. 3 138 734 and EP Patent No. 3 061 587.

Also, mirror reflective elements with heater pad including electrically conductive traces are described by United States Patent Application Publication No. 2016/0221505. United States Patent Application Publication No. 2016/0221505 describes a mirror reflective element assembly for an exterior rearview mirror assembly for a vehicle includes a reflective element and a heater pad. The heater pad includes a heater pad substrate having a plurality of electrically conductive traces established thereat. The heater pad substrate is disposed at a rear surface of the reflective element. The electrically conductive traces may include (i) a heating trace that, (ii) first and second electro-optic control traces and/or (iii) accessory control traces.

U.S. Patent Application No. 2017327167 describes a method for manufacturing an automotive mirror, in particular a side mirror, includes forming a printed circuit board as flexible printed circuit board with n+1 branches, n∈N, providing n modules each including at least one electronic element, and connecting up to n of said branches to one module each and connecting one branch to cables or a cable harness to be connected to a power supply and/or a control unit outside the mirror.

U.S. Pat. No. 8,550,675 B2 teaches an outside mirror lighting assembly which includes a housing and a first glass panel where one or more light emitting devices are positioned at an edge of the first glass panel. Light rays from the at least one light emitting device propagate within the glass panel for illumining its outer periphery. Words, logos, or other indicia may be also be illuminated by direct or indirect light emitted into an etched area of the glass. The mirror assembly supplies a soft illuminated glow around the outer periphery and/or the indicia for proving a unique and pleasing appearance to the user.

US 2008/112176 A1 describes that an exterior rearview mirror has a mirror head, which is provided with a mirror glass and with at least one illuminant, which radiates light through at least one light permeable section to the exterior. Furthermore, the exterior rearview mirror has a mirror base. In order to provide the exterior rearview mirror, so that the light function is performed in an optimum manner through the simple provision of the mirror, at least part of the housing of the mirror head and/or of the mirror base is comprised of at least two plastic layers, having different light permeability. In the light permeable section, the plastic layer with the lower light permeability is missing, or it only has such thickness, that the light emitted by the illuminant radiates to the exterior with sufficient light intensity. The plastic layer with higher light permeability can be used as a light pane for the illuminant disposed behind it. The plastic layer with lower light permeability can be provided to provide the transparent section with a proper color.

DE 20 2016 102 024 U1 discloses a warning indicator system for a vehicle, comprising a warning indicator arranged to surround a reflective element carried in a rearview mirror assembly of the vehicle.

US 2005/276058 A1 teaches an exterior rearview mirror for vehicles, in particular motor vehicles. The exterior rearview mirror has a mirror housing with a mirror glass, which is mounted on a mirror glass support and is encompassed by a frame. The exterior rearview mirror is provided with signal lamps, area lights, and indicator lights that are situated in the mirror housing or in the mirror base. In order to permit a simple, inexpensive installation of a lamp into the exterior rearview mirror so that it does not take up much space, at least one lamp of a built-in light is accommodated in the frame. The lamp, which is fastened to the frame in a non-detachable way, can be accommodated in the frame in a simple, space-saving way and held there securely. The exterior rearview mirror is particularly suited for motor vehicles.

EP 0 967 118 A2 discloses an exterior mirror assembly for a vehicle that includes a signal light that provides an advanced notification system to approaching vehicles that the driver of the vehicle intends to turn or make a lane change. The exterior mirror assembly includes a housing with a reflective element and a positioning device for adjusting the position of the reflective element in the housing, and at least one signal light positioned in the housing. The signal light includes a light source and a light conduiting member which is adapted to project a pattern of light from the housing and yet restrict light from extending into the vehicle so that a driver seated in the vehicle does not directly observe the pattern of light. The light source may be provided by a light pipe which is optically coupled to a remote light source located, for example, in the vehicle. The pattern of light may extend at least rearwardly and laterally from the vehicle. In one form, the light conduiting member includes a light input surface on one end and at least one light emitting surface for directing light outwardly from the housing of the exterior mirror assembly. In another form, the exterior mirror assembly includes a powerfold mirror system which incorporates a security light which directs light in a first light pattern when mirror assembly is in its normal use position and a second pattern when the mirror assembly is in its folded position.

US 2008/106389 A1 describes a mirror reflective element sub-assembly for an exterior rearview mirror assembly of a vehicle, and the sub-assembly includes a mirror reflective element and a video display element. The video display element is disposed behind the mirror reflective element so that images displayed by the video display element are viewable through the mirror reflective element when the video display element is activated. The video display element is configured to display images that are readily viewable by the driver of the host vehicle and not readily viewable by drivers of other vehicles in the lane adjacent to the host vehicle.

EP 2 151 350 A1 teaches a rear view mirror including a reflective element in a cavity of a mirror housing with a mirror head and a mirror base. An indicator light for indicating situation information to a vehicle driver is installed, wherein the indicator light includes light sources and an optical element that allows the light to shine through. The indicator light has a split printed circuit board to support at least two light source elements and a light guide wherein the light emitted from the light sources is coupled into the end faces of the light guide.

US 2010/177523 A1 describes a rearview mirror assembly for use on a vehicle, which comprises a housing configured to be coupled to the vehicle, a mirror coupled within the housing, and a first optical fiber coupled to the housing and visible from the exterior thereof for providing a warning that indicates that the vehicle is turning, braking, and the like.

US 2007/019426 A1 discloses an interior rearview mirror assembly for a vehicle, which includes a reflective element, a frame portion around a perimeter of the reflective element, and one or more user inputs or buttons movably mounted to the frame portion. At least one bezel segment is positioned partially around the perimeter of the reflective element and frame portion and defines a space or gap along the frame portion between opposed and spaced apart ends of the bezel segment or segments. The input or button is mountable to the frame portion at the space and is movable by a user to engage and actuate an electronic switch within the mirror assembly.

EP 1 598 237 A1 teaches a device having a mirror housing with at least one mirror glass mounted on a mirror glass support and enclosed by a frame. At least one light source of a built-in light is mounted in the frame. The light source is overlapped by an upper part of the frame.

Rearview devices are located at a highly visible position with respect to the vehicle driver. State-of-the-art external rearview devices have a typically black or colored bezel surrounding the rearview element. Typically, the rearview element is not attached to the bezel but to an attachment plate to allow for the adjustment of the rearview element to the needs of the vehicle driver. When adjusting the rearview element to the needs of the vehicle driver, the actuators only move the rearview element. Therefore, additional space between the bezel/housing and the rearview element is needed and nothing can be positioned there which leads to lost installation space. Typically, the actuator may adjust the rearview element within an angle of at least 8 to 12 degrees. This additionally leads to electronics and other components placed behind the rearview element to be exposed to environmental conditions.

In addition, rearview devices typically incorporate a number of separate and individual modules for providing different functions such as light modules, heating pads, among other functions. This results in a mirror assembly with many components and which has a high manufacturing cost.

As a result, there is a need for a rearview mirror assembly with an improved space utilization to allow for additional functions and elements to be integrated and to provide additional functions for the driver of the vehicle and other persons.

Therefore, it is advantageous to utilize the highly visible position of the rearview device to provide additional and important information to the driver. Especially when using a sealed rearview device which is integrally formed out of its components and moving the whole rearview device during adjustment of the rearview device to the driver, the additional space previously needed to adjust the rearview element is no longer needed to be kept free and can be used for the installation of additional components and functions into the rear view device directly behind the rearview element and/or attached to the bezel.

SUMMARY

A multi-function rearview device for use with a vehicle includes a rearview element including at least one of a reflective element, a camera, and a display element, a bezel formed at an outer portion of the multi-function rearview device surrounding the rearview element, where the rearview element is attached to at least one of the bezel and a housing which is configured to be attached to the vehicle and to be moveable relative to the vehicle.

The bezel may be made of a plastic substrate which is at least one of colored, surface finished, transparent, and coated.

The coating of the bezel substrate may be at least one of a decorative coating, an advanced surface technology (AST) surface coating, and a spectrally controlling system.

The bezel may be formed or molded from a polymeric substrate.

The bezel may be transparent and may include a chromium-based coating, making the one or more light assemblies beneath the bezel hidden until lit.

The chromium-based coating may be an alloy of chromium and a dopant material, the dopant material being selected from hexagonally close-packed transition metals, the alloy having a crystal structure of a primary body-centered cubic phase in coexistence with a secondary omega hexagonally close-packed phase.

The one or more light assemblies may provide at least one or more light function indications including direction indicator, approach light, strong braking signal, emergency braking signal, logo light, puddle light, Human Machine Interface (HMI), Blind Spot Indicator (BSI), charging indicator status, vehicle mode, sports mode, economy mode, autonomous drive mode, sleep mode, vehicle locked, vehicle stolen, warning signals, temperature or weather indicator, traffic light signal, fuel status, emergency indications for emergency vehicles including a police vehicle, doctor vehicle, ambulance, or traffic maintenance, vehicle communication, handshake, connection indicator, and hazard lights.

The one or more light assemblies may each include at least one of a printed circuit board, a light emitting diode, an integrated lens, a self-charging illuminating material; a flexible circuit board; a bulb; and a lamp.

The light assembly may be configured to direct light to different positions of the bezel.

The light assembly may be configured to direct a light with different characteristics to different positions of the bezel for providing different light function indications.

The plurality of light assemblies may be configured to direct light with different characteristics to different positions of the bezel for providing different light function indications.

The different light characteristics may be determined by at least one of the light color, the light intensity and the light pulse length.

The different positions of the bezel may include at least a position on the bezel above the rearview element, a position on the bezel below the rearview element, a position on the bezel facing the vehicle, and a position on the bezel not facing the vehicle.

The plurality of light assemblies may include four light assemblies, a first light assembly positioned within the interior space of the bezel above the rearview device, a second light assembly positioned within the interior space of the bezel below the rearview device, a third light assembly positioned within the interior space of the bezel at a position on the bezel facing the vehicle, and a fourth light assembly positioned within the interior space of the bezel at a position not facing the vehicle.

The one or more light assemblies may be placed directly on a plastic part of the bezel without using a printed circuit board, or by using a surface mount, over mold, conductive material, or printed material.

At least one of a conductor track, the electronic means and the one or more light assemblies may be directly applied to the bezel by at least one of injection molding (MID), by a conductive foil (IML) and laser direct structuring (LDS).

The one or more light assemblies may include an LED holder with an integrated connector which can be clipped into the interior space of the bezel.

The one or more light assemblies may include at least one light source unit with at least one wire, but not including a printed circuit board, a housing unit supporting the light source unit and being provided with means suited for at least one of holding and connecting, and sealing means.

The one or more light assemblies may include a light source including at least one of an LED light, a light tape, a printed lighting, an optical light guide, a lamp, an illuminating charging material, a charging cell, a solar powered cell, or a battery.

The multi-function device may include the one or more light assemblies, where the one or more light assemblies are configured to direct a plurality of different color lights to an entire surface of the bezel so that the entire bezel can have one color at a time, and are configured to provide a plurality of different color lights to different zones of the bezel so that different zones of the bezel can have different colors at a time.

The housing, the reflective element, and the bezel may be integrally formed so that the multi-function device is sealed from an outside environment to protect against dust, water, or humidity.

The multi-function device may further include a light diffuser positioned within the interior space of the bezel.

The multi-function rearview device may be functionally connected to an actuator, and the actuator may be positioned outside the housing.

The multi-function rearview device may be functionally connected to the actuator by self-docking or direct contact.

The actuator may move the multi-function device entirely including the housing, and not only the rearview element.

The actuator may be configured for at least one of a rotational movement and a translatory movement.

The multi-function device may further include a foot suited to be fixed to the vehicle and relative to which the housing with the bezel is moveable.

The foot may provide at least one spherical seat for the housing.

The housing may include an upper part and a lower part, and the bezel may be attached to both parts.

The bezel may be secured, glued, removably attached, or clipped to the housing.

The bezel may be attached together with at least one of the one or more light assemblies and the electronic means to the housing.

The actuator may determine the light output of the one or more light assemblies.

The actuator may determine the light output of the one or more light assemblies using a LIN or CAN connectivity.

The multi-function device may further include a connection to a control unit of the vehicle to control at least one of the one or more light assemblies, the display element, an actuator, a camera controller, or a cleaning device.

The multi-function device may further include at least one sensor wherein the output of the sensor controls at least one of the one or more light assemblies, the display and an actuator.

The sensor may be a camera.

The multi-function device may further include at least one of a heater and a wiper for the rearview element.

The electronic means may be connected to at least one of the one or more light assemblies, the display element, an actuator, a sensor, a camera, a heater and a wiper.

The electronic means and the bezel may form a unit.

The multi-function device may further include auto dimming elements.

The multi-function device may further include a light sensor for controlling multiple light intensities or light brightness.

The one or more light assemblies may provide at least one or more light function indications including a side marker indication or a parking light indication.

The multi-function device may further include a flexible circuit which includes the one or more light elements, the one or more light elements being directly attached to the flexible circuit.

The flexible circuit may further include a single connector controlling unit configured to control the one or more light elements and to receive an external connector.

The flexible circuit may further include an integrated heating pad configured to heat the rearview element.

The flexible circuit may further include an integrated temperature sensor.

The flexible circuit may further include at least one of an integrated Wi-Fi or Bluetooth communication unit and an antenna.

The flexible circuit may further include an integrated heating pad configured to heat the rearview element and which bends around a slot formed in the bezel.\

The bezel may include a light receiving portion which is configured to receive a light for functioning as an indicator, in particular a side turn indicator.

The one or more light elements may be at least two light elements which are configured to project different colored lights for providing different functions.

The one or more light elements may be at least four light elements which are configured to project different colored lights for providing different functions.

The different functions provided may include direction indicator, approach light, strong braking signal, emergency braking signal, logo light, puddle light, Human Machine Interface (HMI), Blind Spot Indicator (BSI), charging indicator status, vehicle mode, sports mode, economy mode, autonomous drive mode, sleep mode, vehicle locked, vehicle stolen, warning signals, temperature or weather indicator, traffic light signal, fuel status, emergency indications for emergency vehicles including a police vehicle, doctor vehicle, ambulance, or traffic maintenance, vehicle communication, handshake, connection indicator, hazard lights, side marker indication and/or a parking light indication.

DESCRIPTION OF THE SEVERAL VIEWS OF THE DRAWINGS

The foregoing summary, as well as the following detailed description, will be better understood when read in conjunction with the appended drawings. For the purpose of illustration, there is shown in the drawings certain embodiments of the present disclosure. It should be understood, however, that the invention is not limited to the precise arrangements and instrumentalities shown. The accompanying drawings, which are incorporated in and constitute a part of this specification, illustrate an implementation of systems and apparatuses consistent with the present invention and, together with the description, serve to explain advantages and principles consistent with the invention.

DETAILED DESCRIPTION

Figure 1:
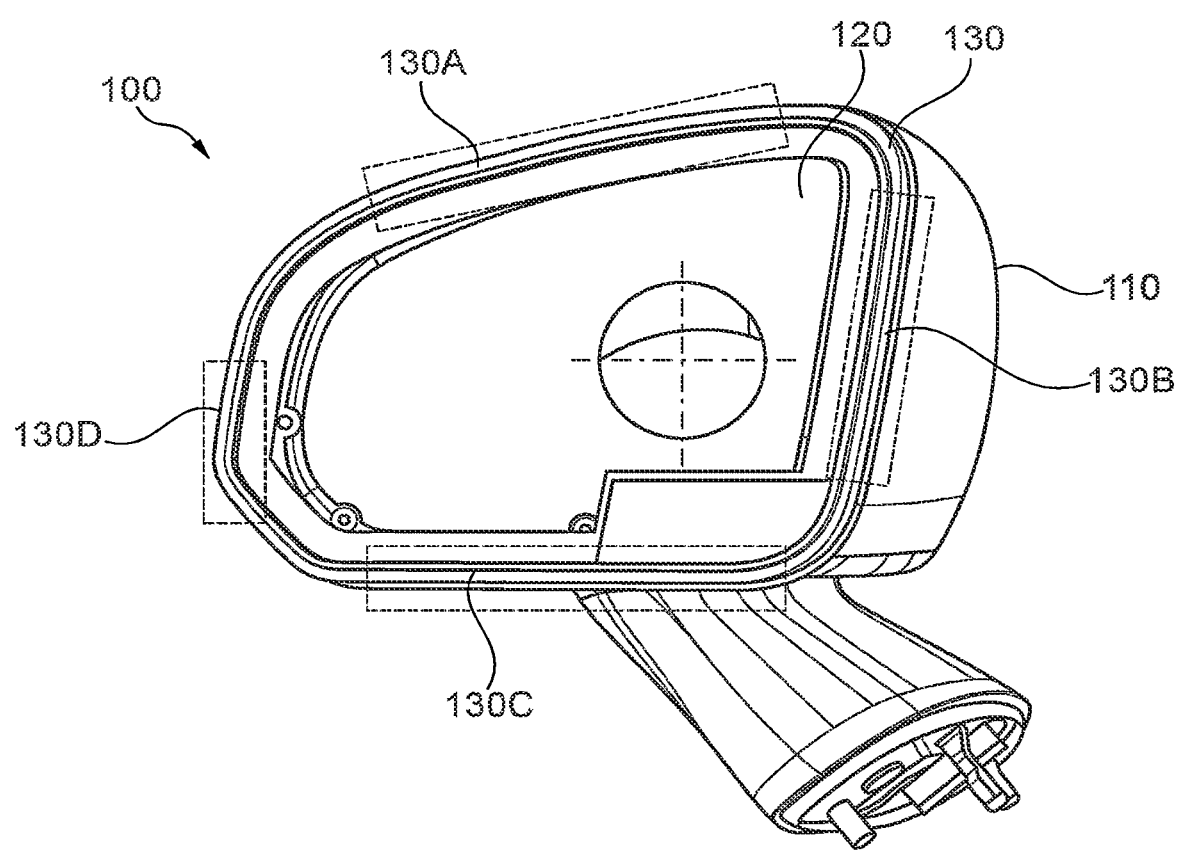
FIG. 1 is a diagram illustrating a perspective view of an example of a rearview device.

Before explaining at least one example of the invention in detail, it is to be understood that the invention is not limited in its application to the details of construction and to the arrangements of the components set forth in the following description or illustrated in the drawings. The Figures and written description are provided to teach any person skilled in the art to make and use the inventions for which patent protection is sought. The invention is capable of other embodiments and of being practiced and carried out in various ways. Those skilled in the art will appreciate that not all features of a commercial embodiment are shown for the sake of clarity and understanding. Persons of skill in the art will also appreciate that the development of an actual commercial embodiment incorporating aspects of the present inventions will require numerous implementation-specific decisions to achieve the developer's ultimate goal for the commercial embodiment. While these efforts may be complex and time-consuming, these efforts nevertheless would be a routine undertaking for those of skill in the art having the benefit of this disclosure.

In addition, it is to be understood that the phraseology and terminology employed herein are for the purpose of description and should not be regarded as limiting. For example, the use of a singular term, such as, "a" is not intended as limiting of the number of items. Also the use of relational terms, such as but not limited to, "top," "bottom," "left," "right," "upper," "lower," "down," "up," "side," "corner," are used in the description for clarity in specific reference to the Figures and are not intended to limit the scope of the invention or the appended claims. Further, it should be understood that any one of the features of the invention may be used separately or in combination with other features. Other systems, methods, features, and advantages of the invention will be or become apparent to one with skill in the art upon examination of the Figures and the detailed description. It is intended that all such additional systems, methods, features, and advantages be included within this description, be within the scope of the present invention, and be protected by the accompanying claims.

FIG. 1 is a diagram illustrating a perspective view of an example of a rearview device 100. Referring to FIG. 1, the rearview device 100 includes a housing 110, a rearview element 120 and a bezel 130. The bezel 130 can be subdivided into multiple different zones 130A, 130B, 130C, 130D. As an example, four (4) different positions or zones 130A, 130B, 130C, 130D are shown. These different positions 130A, 130B, 130C, 130D provide different functions or a combination of different functions, such as indicators to the driver and other persons.

The multi-function rearview device bezel 130 with four, or any number of separate zones 130A, 130B, 130C, 130D, each with one or more or a combination of the following functions (single colored or multiple colored light source): transparent coating; AST coating; charging indicator; logo lamp; approach light side turn indicator; HMI/BLIS; vehicle mode (sport/economy); autonomous driving mode; sleep mode; vehicle locked; vehicle stolen; warning signals; temperature/weather indicator; traffic light signal; strong/emergency braking signal; fuel status; among other functions.

The light in the different positions 130A, 130B, 130C, 130D can have different characteristics, such as color, intensity and pulse length but can also be used to provide the same light at the same time as to illuminate all or part of the bezel 130. A foot may be connected to the rearview device 100.

Figure 2:
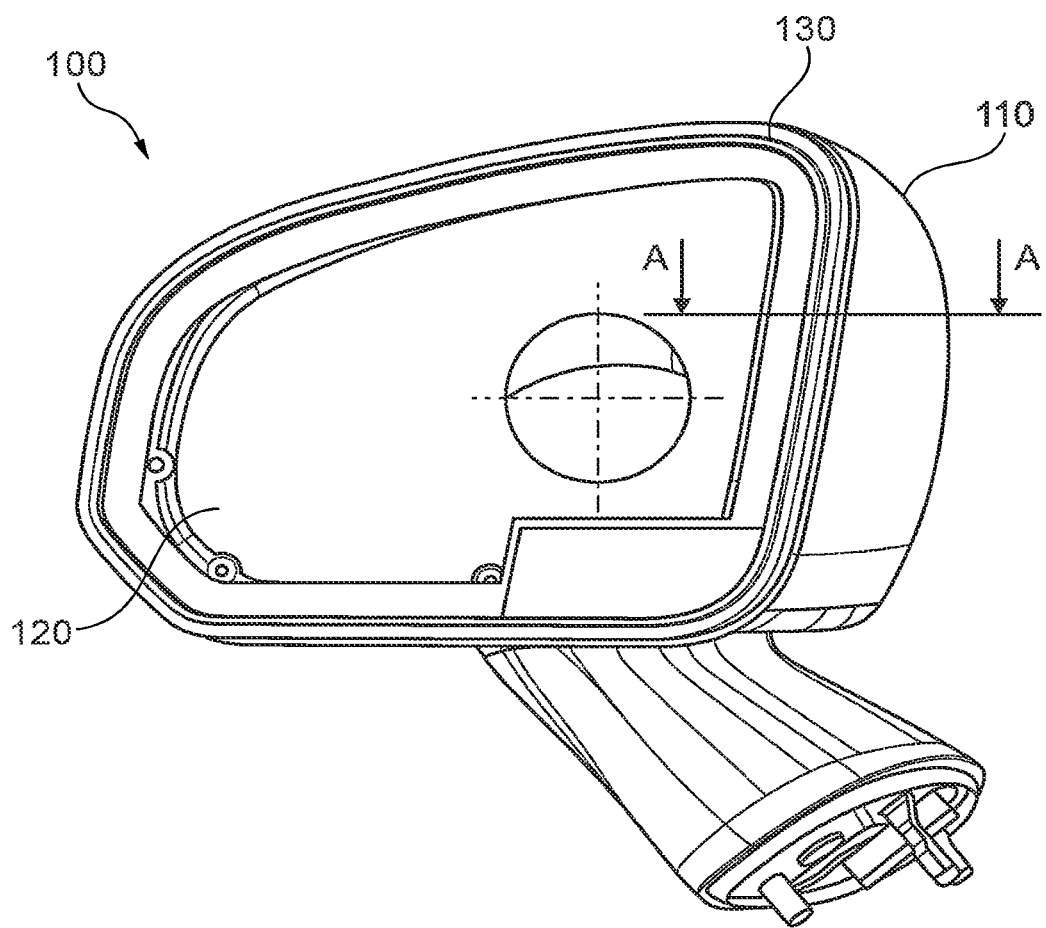
FIG. 2 is a diagram illustrating another perspective view of the rearview device with a line A-A.
Figure 3:
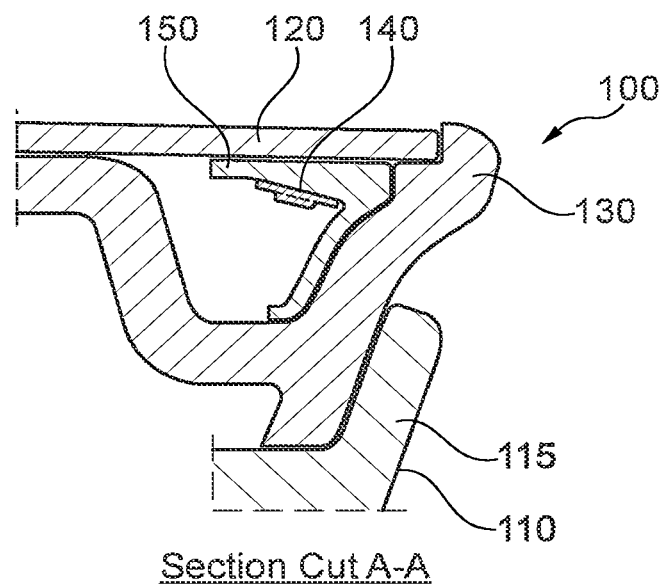
FIG. 3 is a diagram illustrating a sectional view of the rearview device along the line A-A illustrated in FIG. 2.

FIG. 2 shows an example of the rearview device 100 highlighting the line A-A which is used for the cross-sectional view of FIG. 3.

FIG. 3 is a diagram illustrating a sectional view of the rearview device 100 along the line A-A illustrated in FIG. 2. The rearview element 120 of this example is a glass substrate with a reflective coating on the inner surface. A lighting assembly in the form of an LED light strip 140 is attached to a diffuser 150. The diffuser 150 is attached to the bezel 130. The bezel 130 is a multi-functional exterior glass bezel 130 with an integrated transparent and chrome-based coating as to function as a cosmetic mirror bezel molding. A painted part 115 of the housing 110 is shown, which can be scalp painted.

Figure 4:
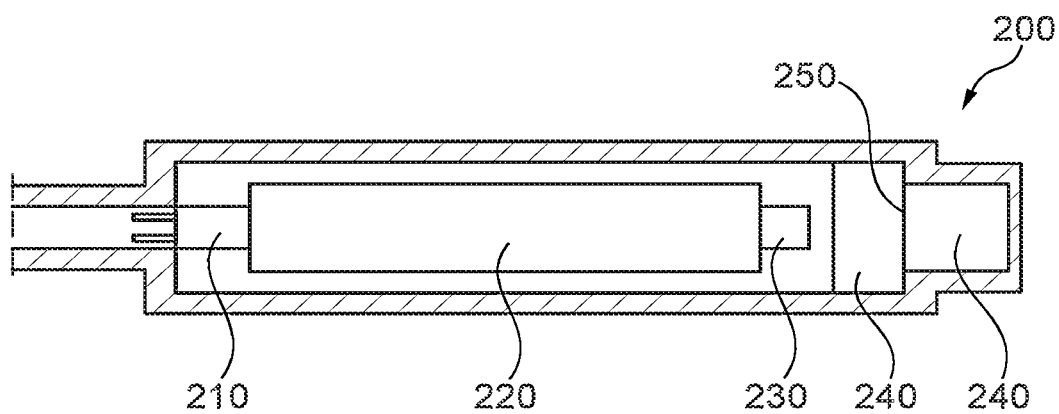
FIG. 4 is a diagram illustrating an example of a light assembly.

FIG. 4 is a diagram illustrating an example of a lighting assembly 200. The lighting assembly 200 of this example includes a connector 210, a PCB board 220, an LED 230, one or more lenses 240 and at least one filter 250. The light assembly may be placed in an external housing 260.

Figure 5:
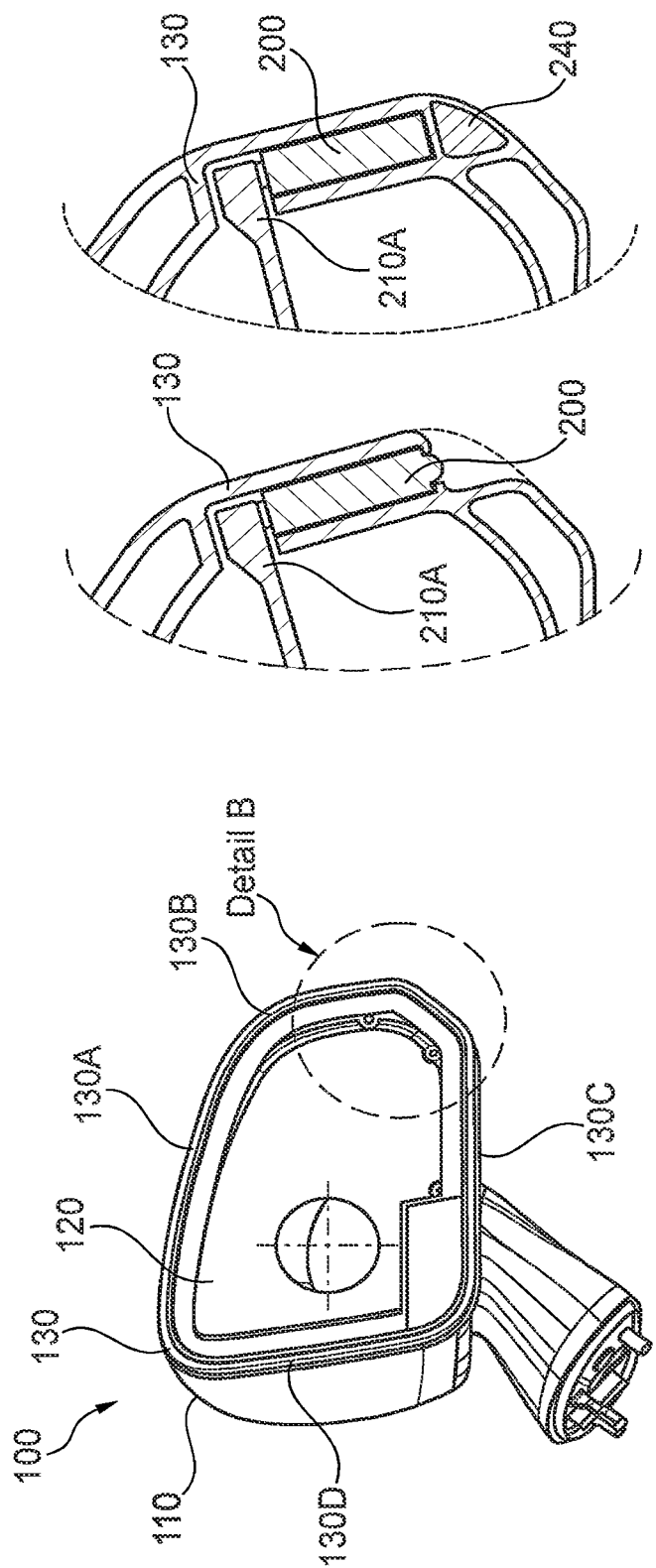
FIG. 5 is a diagram illustrating a perspective view of the rearview device and two examples of a detail of the rearview device.

FIG. 5 is a diagram illustrating a perspective view of the rearview device 100 and two examples of a detail of the rearview device 100.

Referring to FIG. 5 and the detail of the rearview device 100, a light assembly 200 according to FIG. 4 may be placed inside the rearview device 100. An external connector 210A is shown to control and provide power to the light assembly 200. The rearview device 100 includes the multi-functional external mirror glass bezel 130 and is shown once without and once with an integrated lens 240.

According to the aforementioned examples, this description provides a multi-functional rearview device 100 for use with a vehicle including a multi function rearview element 120, a housing 110, and a bezel 130. The housing 110 may be configured to be attached to the vehicle and to be moveable relative to the vehicle when attached thereto. The rearview element 120 may include at least one of a reflective element and display element and is attached to at least one of the housing 110 and the bezel 130.

The housing 110 can be made out of a single part or may include an upper and a lower part where the bezel 130 is attached to both parts.

The bezel 130 may be formed at an outer portion of the housing 110 surrounding the rearview element 120 and may include an interior space formed within the bezel 130 and at least one of one or more light assemblies 200 and one or more electronic means positioned within the interior space of the bezel 130. The bezel 130 may be formed as one integral portion or may be formed from multiple segments 130A, 130B, 130C, 130D such as two segments including an upper and lower portion, four segments 130A, 130B, 130C, 130D including four sides, or any number of segments.

The bezel 130 can be formed or molded from any type of glass. Glass is here used in the sense of a non-crystalline amorphous solid showing a glass transition when heated towards the liquid state. Especially suited are polymeric substrates not only due to their light weight, cost efficiency and durability. The bezel may be interchangeable and removable with a standard non-lit bezel so that a non-lit bezel may be removed and a bezel providing lighting and indications is substituted in its place. The non-lit bezel may be opaque, clear, transparent, or translucent. Similarly the lit bezel may be opaque, clear, transparent, or translucent.

The bezel 130 can be molded to include recesses at the interior face to house at least one or more light assemblies 200, one or more electronic means and other internal structures of the rearview device 100.

The bezel 130 may include a colored, surface finished, transparent or coated surface and it or the space beneath it may be used to house at least one of light electronics and at least parts of other functions such as a heater or a wiper incorporated within the rearview device.

The bezel 130 can also be configured to be secured, glued, clipped, or removably attached in any way to the housing 110.

The transparent material or the surface coating can be used to communicate light from the one or more light assemblies 200 inside the rearview device 100 to the outside, for example to the driver of the vehicle or to any other person or sensor watching the rearview device 100. For example, a transparent bezel 130 including a chromium-based coating may be used, thus making the light assemblies 200 beneath the bezel 130 hidden from the outside viewer until lit.

The chromium-based coating can be an alloy of chromium and a dopant material, the dopant material being selected from hexagonally close-packed transition metals, the alloy having a crystal structure of a primary body-centered cubic phase in coexistence with a secondary omega hexagonally close-packed phase.

The multi-function device or bezel 130 may include only one light assembly 200 or multiple light assemblies 200. The one light assembly 200 or the multiple light assemblies 200 can be configured to direct light to different positions of the bezel 130 and can provide different light characteristics for different positions of the bezel 130 to provide different light function indications. These different characteristics can include at least one of the light color, the light intensity and the light pulse length.

The coating can obstruct different light applications. To be able to shape the light according to different needs, part of the bezel surface can be spared from the coating or the coating can be removed afterwards to form special shapes. A lens 240 may be molded directly into this or other parts or added afterwards. This allows for example to project a company logo to the ground when no coating is applied or when the coating is removed from the lower part of the bezel 130.

The different positions of the bezel 130 may include at least a position 130A on the bezel 130 above the rearview element 120, a position 130C on the bezel 130 below the rearview element 120, a position 130B on the bezel 130 facing the vehicle, and a position 130D on the bezel 130 not facing the vehicle. Within each position a single light assembly 200 can be positioned within the interior space of the bezel 130. For example, a first light subassembly 200 can be positioned within the interior space of the bezel above the rearview device 120, a second light assembly 200 positioned within the interior space of the bezel 130 below the rearview device 120, a third light assembly 200 positioned within the interior space of the bezel 130 at a position on the bezel 130 facing the vehicle, and a fourth light assembly 200 positioned within the interior space of the bezel 130 at a position not facing the vehicle.

Alternatively, the bezel 130 can be subdivided into numerous positions to provide multiple different light functions and multiple different light subassemblies 200 can be positioned within the interior space of the bezel at numerous positions.

The one or more light assemblies 200 can include a light source 230 having at least one of an LED light, a light tape, a printed lighting, an optical light guide, or a lamp.

The one or more light assemblies 200 or the electronic means can be directly placed on a plastic part or on the bezel 130 without using a printed circuit board 220. One or more conductor tracks can connect different parts of the one or more lighting assemblies and the electronic means and connect also to other electrical systems inside and outside of the rearview device 100. Alternatively, the plastic part or the bezel 130 can be molded around the conductor tracks, the one or more light assemblies 200 or the electronic means. The at least one conductor track, the electronic means and the one or more light assemblies 200 can be directly applied to the plastic parts or the bezel 130 by one or more of injection molding (MID), a conductive foil (IML), and laser direct structuring (LDS).

The one or more light assemblies 200 can also include an LED holder with an integrated connector 210 which can be clipped into the interior space of the bezel 130.

The one or more light assemblies 200 can also include at least one light source unit 230 with at least one wire, no printed circuit board, a housing unit supporting the light source unit and designed with means suited for at least one of holding and connecting as well as scaling means to protect and seal the LED from the environment.

The one or more light assemblies 200 can be configured to direct a plurality of different color lights to an entire surface of the bezel 130 so that the entire bezel can have one color at a time, and can be configured to provide a plurality of different color lights to different zones of the bezel so that different zones of the bezel can have different colors at a time.

In an example, the light assemblies may include a printed circuit board (PCB) 220, a light emitting diode (LED) 230 and an integrated lens 240.

The light stemming from the one or more light assemblies 200 of the different embodiments can be used to provide at least one or more light function indications at different positions including direction indicator, blind spot indicator, approach light, strong braking signal, emergency braking signal, logo light, puddle light, human machine interface, charging indicator status, vehicle mode, sports mode, economy mode, autonomous drive mode, sleep mode, vehicle locked, vehicle stolen, warning signals, temperature or weather indicator, traffic light signal and fuel status.

In certain examples, at least some of the light may be directed at the ground or to the direction of other persons or sensors outside the vehicle to communicate information. The rearview device may further include a light diffuser positioned within the interior space of the bezel. The housing 110, the reflective element 120, and the bezel 130 of the rearview device 100 may be integrally formed so that the multi-function device 100 is sealed from an outside environment.

The multi-function rearview device 100 can be functionally connected to an actuator, whereby the actuator is positioned outside the housing. This can allow the actuator to move the multi-function device 100 entirely including the housing 110, and not only the rearview element 120. The actuator can be configured to perform one or more different types of movements, among them being rotational movements and translatory movements.

The actuator can also be configured to determine the light output of the one or more light assemblies 200. The rearview device 100 may include a foot suited to be fixed to the vehicle and relative to which the housing 110 with the bezel 130 is moveable.

In an example, the foot provides at least one spherical seat for the housing 110.

In another example, the bezel 130 is attached together with at least one of the one or more light assemblies 200 and the electronic means to the housing 110

The rearview device 100 may include a connection to a control unit of the vehicle to control at least one of the one or more light assemblies 200, the rearview element 120 and an actuator Additionally, the rearview device 100 can include at least one sensor. The output of the sensor can be used to control at least one of the one or more light assemblies 200, the reflective element 120, the actuator or any other functions and systems, such as a heater and a wiper.

The rearview device 100 can include a connection to a control unit of the vehicle to control at least one of the one or more light assemblies 200, the rearview element 120 and an actuator. This sensor can be for example a camera.

The rearview device 100 can further include additional functions and system such as a heater or a wiper. The electronic means can be configured to control and connect one or more of the one or more light assemblies 200, the display element 120, an actuator, a sensor, a camera, a heater and a wiper. The electronic means can also form a unit together with the bezel 130.

Figure 6:
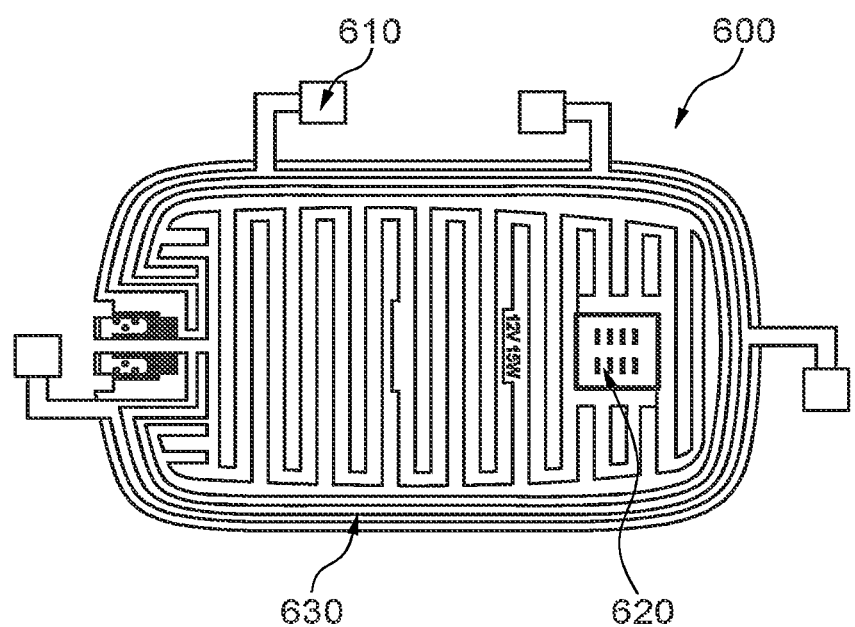
FIG. 6 is a diagram illustrating an example of an integrated flexible circuit including one or more lighting elements.

FIG. 6 is a diagram illustrating an example of an integrated flexible circuit 600 including one or more lighting elements 610.

Referring to FIG. 6, light and signal modules and sensors that are provided in exterior door mirrors are typically provided as individual module assemblies and connected using conventional wire harnesses to individual rigid PCBs. In a preferred example, the rearview device may include lighting, sensors and heating functions which are all incorporated into one flexible printed circuit/ribbon circuit 600 which is secured using adhesive to a surface of the rearview device such as to a glass surface to operate as a heat sink. The flexible circuit 600 may provide single point electrical connection and self-docking connection to all peripheral mirror functions and mounting surfaces for LED lights and electronic components while also providing flexibility to position the lights and sensors in the correct positions. Accordingly, these peripheral electrical functions may be integrated into the fixed glass case bezel and can be removed, assembled, or serviced in one easy operation utilizing the rotation assembly motion of the glass carrier bezel.

In this example, the flexible circuit 600 may include one connector controlling unit 620 and a flexible heater pad or ribbon circuit 630 to which one or more lighting elements 610 are directly attached.

Figure 7:
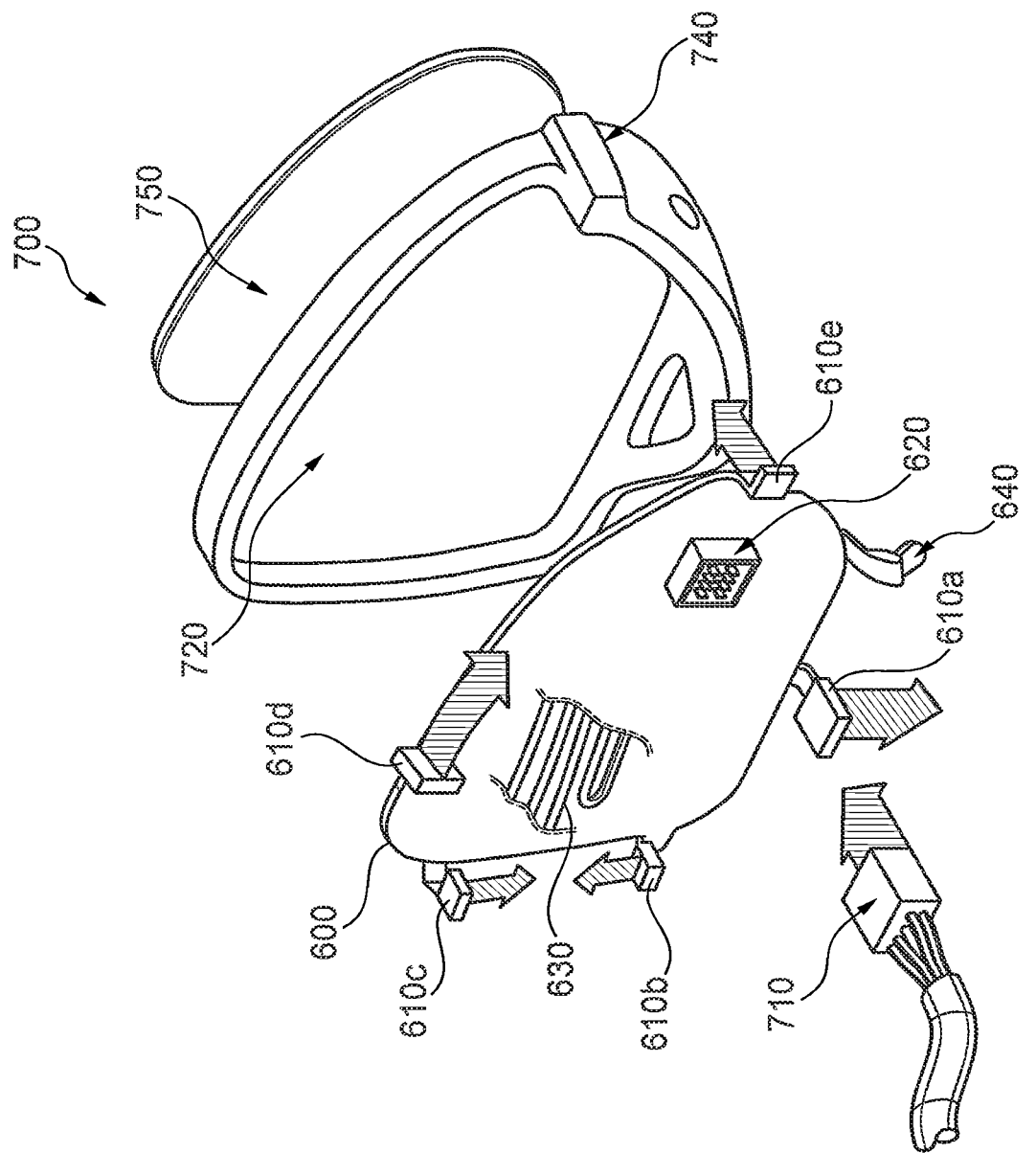
FIG. 7 is a diagram illustrating a perspective view of an example of a rearview device including the integrated flexible circuit of FIG. 6.

FIG. 7 is a diagram illustrating a perspective view of an example of a rearview device including the integrated flexible circuit of FIG. 6.

Referring to FIG. 7, a rearview device 700 may include the integrated flexible circuit 600. As already described in reference to FIG. 6, the flexible circuit 600 includes one connector controlling unit 620 and a flexible heater pad or ribbon circuit 630 to which one or more lighting elements 610 are directly attached. In this example, five lighting units are attached and face in separate directions and may project different colored lights as described throughout this application. For example, first light 610a may project a blue light, second and third lights 610b, 610c may project a red light, fourth light 610d may project a green light, and fifth light 610e may project a yellow light, all light being able to change colors and able to be used for different functions. The one connector controlling unit 620 may control all function on the bezel including all lighting elements 610a-e and the heating pad and a temperature sensor 640. The connector controlling unit 620 may be configured to receive a harness with a connector 710, and is described preferably as one controlling unit 620 may but more than one may be provided.

Accordingly, the case bezel 720 of the rearview device 700 may be provided as part of a single piece fixed glass bezel assembly with integrated lighting and other modules. The bezel 720 may include a light receiving portion 740 which forms a built in Side Turn Indicator module, in this case, receiving light projected by the fifth light 610e. A glass reflector 750 may be provided on an opposite side of the bezel 720, but it should be appreciated that the described bezel 720 and flexible circuit 600 are equally applicable for use in a camera monitoring system (CMS).

In providing a single piece fixed glass bezel assembly 700 with integrated flexible circuit/ribbon 600, one assembly is provided that integrates all peripheral electrical mirror functions into one easily serviceable part allowing for easy customer upgrade possibilities and reducing service costs. Electronic components fixed to the flexible ribbon 600 may also provide a mirror glass defrost heater element and could also utilize the mirror glass as a heatsink. A single point electrical connector 620 integrated into the flexible circuit 600 will provide electrical connection to the vehicle and could be connected using a traditional electrical connector or a self-docking connector when used in conjunction with the rotating bezel concept. This also provides for reduced packaging space and repeatable locations/routing for multiple features.

Figure 8:
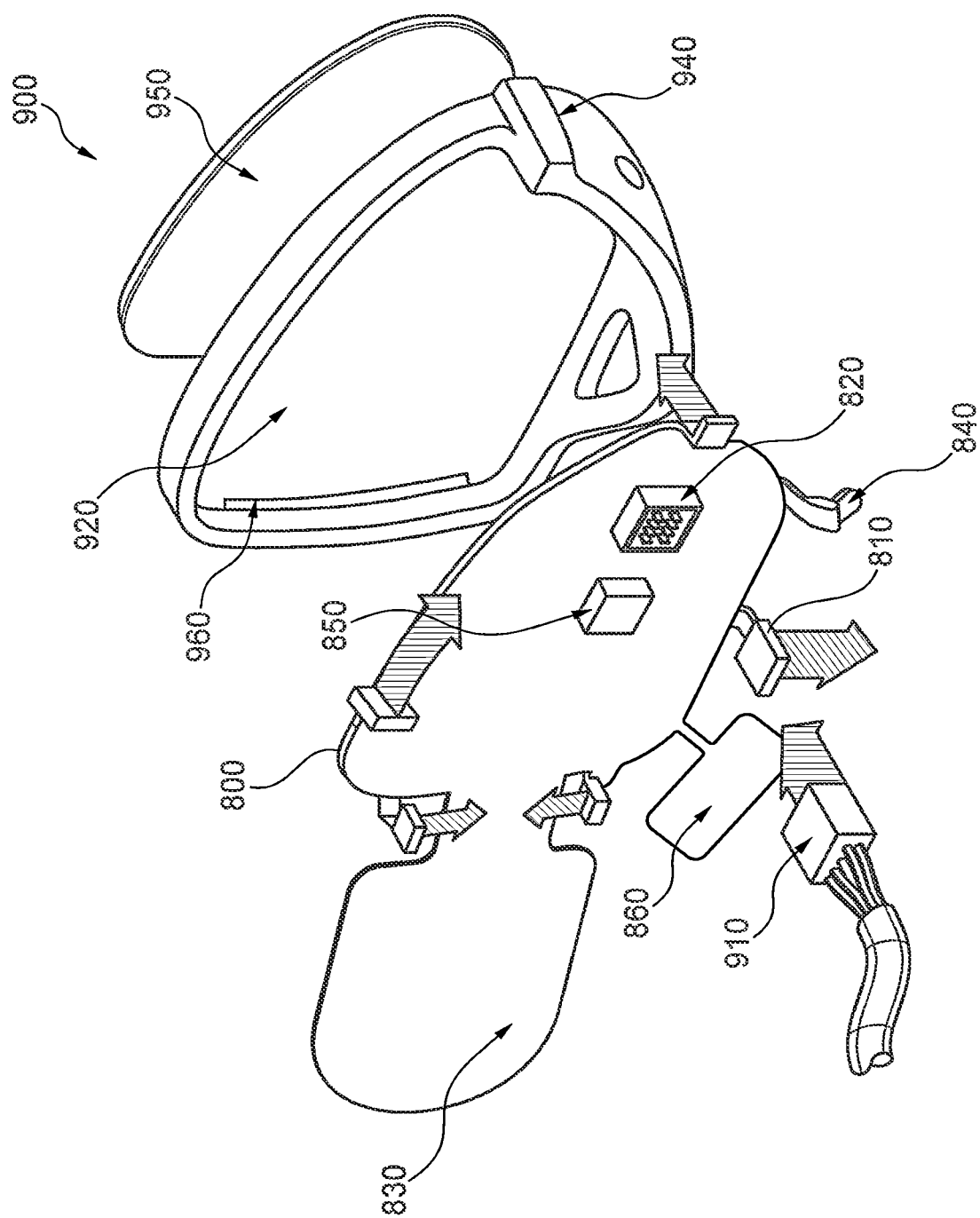
FIG. 8 is a diagram illustrating a perspective view of another example of a rearview device including another integrated flexible circuit.

FIG. 8 is a diagram illustrating a perspective view of another example of the rearview device including another integrated flexible circuit.

Much like the rearview device 700 of FIG. 7, the rearview device 900 of FIG. 8 includes a flexible circuit 800 with integrated lighting elements 810, an electrical connector 820, and a temperature sensor 840. The flexible circuit 800 may include an attached heater pad 830 which is formed as an appendix to the main body of the flexible circuit 800; for example, attached by a narrower neck portion to the main body of the flexible circuit 800. This allows for the heater pad 830 to be received in a slot 960 formed in the bezel 920 so as to position the heater pad 830 in an ideal location such as bent around the slot 960 and behind the glass reflector 950. In addition, the flexible circuit 800 may also include a communication module 850 such as a Bluetooth or Wi-Fi module, and an integrated antenna 860.

Similar to the rearview device 700, the rearview device 900 may be configured to receive a harness with a connector 910. The case bezel 920 of the rearview device 900 may be provided as part of a single piece fixed glass bezel assembly with integrated lighting and other modules. The bezel 920 may include a light receiving portion 940 which forms a built in Side Turn Indicator module, in this case, receiving light projected by the fifth light 810. A glass reflector 950 may be provided on an opposite side of the bezel 920, but it should be appreciated that the described bezel 920 and flexible circuit 800 are equally applicable for use in a camera monitoring system (CMS).

This application also relates to a light assembly, a rear view device, and a light module for a light assembly of an exterior rear view device for a vehicle, as described in U.S. patent application Ser. No. 15/256,540, which is hereby incorporated by reference herein in its entirety for all purposes.

A light module for a light assembly of an exterior rear view device may include a light source unit with at least one wire, which is suited for an electric connection with a printed circuit board of the rear view device, in particular of the light assembly. The light module further includes a housing unit supporting the light source unit, and is provided with connecting and/or holding means which are suited for the attachment to at least one part, in particular a housing part, of the rear view device. The light module further includes sealing means, which are suited for a water and dustproof connection between the light module and the at least one part.

It is preferred that the light source unit includes an optoelectronic component electrically connected with the wire(s), a radiation surface, preferably provided by a transparent and/or translucent resin embedding the optoelectronic component, and an light source housing, either included by the housing unit or attached to the housing unit.

Further, preferred examples may be characterized in that the housing unit may be formed together with the light source housing and/or the sealing means, such as by hot embossing or 2-K injection molding.

The housing unit may be formed with a through hole for each wire, and/or the housing unit may be formed with a receiving structure for the light source unit, and/or the housing unit may be formed with the connecting and/or holding means, such as for a plug or snap connection.

The connecting and/or holding means may include at least 2 snaps, each snap being provided with a stop element. In another example, 1 snap may be used, in another example, 3 snaps may be used, and in another example, 4 snaps may be used, and any number of snaps may be used.

Further, the sealing means may be placed around the perimeter of the housing unit or may form the perimeter of the housing unit in the region supporting the light source unit. Additional examples may be characterized in that one or more light source units may be supported by the housing unit, and/or each light source unit includes an LED unit with one or more LEDs. In another example, at least two light source units are used. In another example, at least three light source units are used, and any number of light source units may be used.

In addition, a light assembly of an exterior rearview device may include a side turn indicator, a blind spot detection, a logo lamp, a door handle light and/or an approach light with at least one light module as described herein.

The light assembly may include at least one printed circuit board remote from the light module to which the one or more wires is soldered and providing a soldering pad pattern.

The soldering pad pattern may include at least 1 pad, preferably 2 pads, for each light module, with each pad having an area of 3 to 5 mm² and/or the 2 pads having a distance of at least 0.5 mm or an extension of a length and/or width of at least 0.5 mm, and/or outside the pad(s) a solder resistant is provided on the printed circuit board.

An electronic circuit board unit may be connected to each light module and a power supply, and/or one electronic circuit board unit may be connected to two or more light source units, in particular the light source units being connected in series or in parallel.

The electronic circuit board unit may include at least one driver circuit for directly or indirectly connecting to the power supply and at least one printed circuit board, preferably one printed circuit board for all light modules of a plurality of light modules or one printed circuit board for each light module.

At least one plug connection for electronically and physically connecting the printed circuit board(s) and/or the driver circuit may be provided.

In addition, the invention may also provide an exterior rearview device for a vehicle, including at least one light module as described herein and/or at least one light assembly as described herein.

The radiation surface of the light module may flush with the exterior surface of at least one housing part of which the light module is attached via its connecting and/or holding means. In another example, the radiation surface of the light module overlaps or underlaps with the exterior surface of the at least one housing part of which the light module is attached, and a number of different overlapping, flush, or underlapping arrangements may be used.

The light module may be provided with a plurality of advantages by making usage of three components in form of a light source unit, a housing unit, and a sealing means. At first, it is to be noted that the light source unit, which can be an LED unit, may be without a printed circuit board such that a solderless light source holder is provided which reduces production costs. In addition, the housing unit not only holds or supports the light source unit but also is provided with connecting and/or holding means for facilitating the attachment of the light module in a rearview device, which also reduces production costs. Still further, due to the fact that the sealing means is provided for water and dustproof, the lifetime of the light module within the exterior rearview device is prolonged.

It can be advantageous to form the housing unit together with a light source housing of the light source unit and/or the sealing means, such as with a 2-K injection molding process to further save costs.

The light module may be connected to a remote printed circuit board because it may not have its own such that a high degree of flexibility with respect to mounting positions within the exterior rearview device may be provided. Thus, a light assembly including a single printed circuit board connected to a plurality of electronic consumer units, including light modules as described herein, may have a very simple system architecture with a reduced amount of parts.

The printed circuit board of the light assembly may have an improved heat dissipation and enhanced performance due to a special soldering pad pattern. For example, one light module of the invention may be connected with two wires to two pads of said pattern with the minimal distance between two pads being at least 0.5 mm and/or there being an extension at each pad having at least one dimension of at least 0.5 mm. Still further, the printed circuit board can be covered by a solder resistant outside the soldering pads.

In case the light module is provided with several light source units connected in parallel, the amount of wires to be connected to the soldering pad pattern can be reduced compared to a separate arrangement of each light source unit.

An exterior rearview device of the invention can include one or more light modules, in particular for providing a side turn indicator, a blind spot detection, a logo lamp, a door handle light and/or an approach light. Each of those functions can be fulfilled by a light module with all of the light modules being connected to a single circuit board arranged remote from said light modules providing a high degree of flexibility with respect to the arrangement of the light modules within the exterior rearview device.

As each light module is provided with a sealing means, substantially no water and dust can enter the interior of the exterior rearview device which is necessary to guarantee a long lifetime.

This application also relates to an electronic device configured for use in a rear-view device of a motor vehicle and a rear-view device including such an electronic device, as described in U.S. patent application Ser. No. 15/256,532, which is hereby incorporated by reference herein in its entirety for all purposes.

An improved rear-view device for a motor vehicle which is configured for use in a rear-view device for a motor vehicle includes at least one housing device having at least one floor piece and a cover piece arranged or that can be arranged on the floor piece, which in the joined state delimits an at least almost completely closed cavity, with at least one first retaining means of a retaining unit, through which the housing device can be or is fixed in or on the rear-view device, and with at least one electronic module, including at least one conductor unit and at least one contact means connected with the conductor unit, wherein on a surface of the floor piece and/or cover piece turned towards the cavity the conductor unit is arranged, having at least one carrier and at least one conductor track applied directly to the carrier, the contact means extending through the cover piece and/or through the floor piece with at least one protruding contact section is accessible externally, the at least one carrier of the at least one conductor unit is formed at least in sections by a functional surface of the floor piece and/or the cover piece adjacent to the cavity and turned towards the cavity, and the cover piece and/or floor piece with the at least one first retaining means of the retaining unit form or forms a common component.

Additional preferred examples of the electronic devices are also described.

In that at least one carrier of a conductor unit is formed at least in sections by a functional surface of the floor piece and/or the cover piece, the electronic device has fewer components and can be compactly designed. This also reduces the assembly effort.

Apart from the conductor tracks the conductor unit can include further electronic components such as integrated circuits (IC), capacitors, resistors and similar. These can also be arranged on the carrier, in particular on the functional surface of the floor piece and/or the cover piece.

The conductor unit can have a board-like design, without having a separate component. In such a case the conductor unit can be formed entirely of the functional surface. It is conceivable that components of the conductor unit are attachable as separate components to the functional surface, without the conductor unit as a whole being formed by the separate component.

In a further development, at least one carrier of the at least one carrier may be formed entirely by the functional surface of the floor piece and/or cover piece. In such a case, a carrier of the electronic module formed as a separate component can be fully dispensed with, if the functional surface of the floor piece or the cover piece takes over the function of the carrier previously formed as a separate component.

The conductor track applied to the carrier, for example, to the functional surface, can essentially be realized according to the conductor units formed as separate components. The electronic device, however, can have a compact design when the conductor track is applied directly to the carrier by injection molding (Molded Interconnect Devices [MID]), by a conductive foil (Inmold-Labeling [IML]) and/or by Laser Direct Structuring [LDS] directly to the carrier such as to the functional surface.

Furthermore, the number of housing devices and electronic modules arranged therein can be reduced if the electronic module includes a plurality of conductor units and/or if the electronic module forms a common control unit for a plurality of electrical loads of the rear-view device, wherein each electrical load is or can be functionally assigned with at least one conductor unit and wherein in particular at least one main conductor unit includes a driver circuit via which the conductor units functionally assigned to the electrical loads are individually and/or jointly controllable.

This allows combining the electronic modules previously operated separately and independently of one another in a common electronic module. In this way, the number of housing devices to be allowed for can also be reduced to a single housing device, in which the common electronic module is arranged. This allows the rear-view device to have a compact design with fewer components, since less space is allowed for to accommodate the electronic device.

The at least one retaining unit may include at least one first retaining means, which together with the cover piece and/or the floor piece forms a common component, such as an injection molded part.

If the first retaining means of the retaining unit with the cover piece or the floor piece forms a common component, in particular an injection-molded part, the electronic device can be designed with less components and the ease of assembly further increased.

It has further proven advantageous if the housing device can be or is fixed by the retaining unit, in particular by the first retaining means, detachably, in particular by means of a rear grip, in or on the rear-view device and/or if the first retaining means includes an externally threaded section on the cover piece or on the floor piece, a latching element, such as clips or a bayonet fitting, and/or a screw or bolt element.

In a further development of the abovementioned exemplary embodiment it has proven advantageous if the retaining unit includes a second retaining means fixed in or on the rear-view device, in particular fixed to a retaining plate of the rear-view device, including an internally threaded section, which is able to interact with the first retaining means designed as externally threaded section, including a rear-gripping receiving means interacting with the first retaining means designed as a latching element and/or an accommodation for the first retaining means designed as a screw or bolt element.

When manufacturing the electronic device individual components of the electronic module are arranged mechanically on the functional surface of the cover piece and/or of the floor piece. Here the tool used for assembling the components of the electronic module runs parallel to a plane of the functional surface of the cover piece and/or of the floor piece, said plane being spanned by vectors in x and y direction, wherein when joining individual components transversally to this plane, the tool runs along a z direction. In order to keep the movement in z direction low, it has proven advantageous if the first retaining means is fixed with a first end to an end of the cover piece or the floor piece opposite of the functional surface of the cover piece or the floor piece and is arranged with a second end extending in the direction of the functional surface, wherein the first retaining means is designed to extend without overlapping to the plane of the functional surface and the second end has a distance from the plane of the functional surface.

For example, the first retaining means may be designed as a clip. In such a case, the retaining means designed as clips may extend in a z direction without protruding beyond the functional surface. This means that wide assembly paths of the tool used for assembly, which would be necessary for retaining means protruding beyond the functional surface, can be prevented in order not to damage the retaining means.

If the first retaining means, for example, includes an externally threaded section on the cover piece or on the floor piece of the housing device and the second retaining means includes an internally threaded section, the electronic device can be readily fixedly screwed into the rear-view device without tooling.

If the first retaining means includes a latching element and the second retaining means a receiving means interacting with the latching means, the electronic device can be assembled simply by clipping the electronic device in the rear-view device. Furthermore, in such a case the maintenance of the electronic device is also simplified, since the electronic device can be mounted on the rear-view device without tooling or removed without tooling by releasing the clip connection.

The electronic device may be connected with a power source if the at least one protruding and externally accessible contact section of the at least one contact means includes at least one pin, in particular a plurality of pins, via which the electronic module can be or is connected with at least one power source and/or with at least one electrical load.

Furthermore, in one example of the electronic device, the electronic device may include at least one energy storage arranged in the cavity of the housing device and functional assigned in the electronic module for storing and releasing electrical energy.

In such a case it is for example possible to hold an energy reserve independent of the power source in order for example to balance peaks or in order in the event of a power supply failure to keep a reserve of energy available in order, for example, to maintain warning light functions for at least a limited time.

In order to simplify joining of the cover piece to the floor piece and to reduce the danger of tilting when joining the cover piece to the floor piece, the cover piece and the floor piece may include a cylindrical section by which, when they are being joined, they can be slid into each other. They may be slid concentrically or telescopically, and the cover piece may include an edge section protruding radially with respect to the cylindrical section and extend fully around the outer surface of the cover piece, which when the cover piece and the floor piece are joined forms an end stop.

As a result of the round shape, an even distribution of the clamping force of the retaining unit may be achieved and through the provision of a uniform, round, contact area, a good scaling surface may be made available.

In a further development, the cover piece and/or the floor piece may have a pot-like design, where at least the cover piece includes an extensive base plate adjacent to the cylindrical section, which runs transversally or inclined to the axis of the cylindrical section, and on its side turned towards the floor piece the functional surface is arranged and on its side turned away from the floor piece and surrounded by the cylindrical section the contact section of the contact means is arranged.

As a result of the floor piece and the cover piece each being designed with a cylindrical section, which when they are being joined can be concentrically and telescopically slid into each other, a uniform contact area is made available. In this way a gap existing between the floor piece and the cover piece can be kept small. The electronic device may include at least one sealant arranged between the cover piece and the floor piece, in particular between the floor piece and the edge section of the cover piece, through which the cavity of the housing device can be sealed with respect to a gap existing between cover piece and floor piece.

In this way an ingress of moisture and dirt into the cavity is prevented, through which danger of contamination of or damage to the electronic module is reduced.

The electronic device can be particularly easily assembled and disassembled, for maintenance purposes, if the floor piece of the housing device includes a one-piece element of a component, in particular a one-piece injection-molded part, such as the retaining plate, of the rear-view device. In such a case the individual components of the electronic device can be pre-assembled so that for final assembly just the cover piece, to which the electronic module, the first retaining means of the retaining unit as well as the sealant are fixed, is screwed or glued to the floor piece. In this way the previous plurality of individual electronic modules with the previous plurality of housing devices, which in each case were formed by a plurality of separate components, can be assembled and disassembled in a single movement.

The electronic device can furthermore be manufactured with reduced weight and economically, if the floor piece, the cover piece, the first retaining means, and/or the second retaining means includes a plastic.

The electronic device can be designed as a lighting module, in particular for a perimeter light of the rear-view device.

A rear-view device may include at least one electronic device as described herein. The rear-view device can contain at least one reflective element and/or at least one camera. The electronic device and the rear-view device have proven to be advantageous in a number of respects:

Because a floor piece and/or the cover piece includes a functional surface turned towards the cavity, which at least partly forms the carrier of the conductor unit, the electronic device can be designed with a reduced number of components.

Because in the housing device a plurality of conductor units can be arranged, which form a common electronic module, the previous plurality of electronic devices can be arranged in a common electronic device, such as in a common housing device. In this way, the space that has to be allowed for in the rear-view device is reduced.

Also described is a head section and a rearview device which can be designed in a compact manner device as described in U.S. patent application Ser. No. 15/000,754, which is hereby incorporated by reference herein in its entirety for all purposes.

This object is attained by a head section by means of the fact that the housing section and the lid section tightly seal the hollow area towards the outside over at least almost the entire circumference.

Due to the fact that the hollow area is surrounded at least almost over its entire circumference towards the outside, the hollow area is protected against penetration by dirt and humidity. This makes it possible to arrange the at least one electronic unit in the hollow area without its own seal. This makes it possible to create a compact design for the head section.

In general, it is feasible to provide the electronic unit with its own housing, with which it can be arranged in the hollow area between the housing section and the lid section. However, it has been shown to be advantageous when the at least one electronic unit can be arranged or is arranged without housing in the hollow area.

The housing section and the lid section can in general be connected to each other in any manner required. With one embodiment of the head section according to the invention, it is provided that the housing section and the lid section can be locked or are locked relative to each other at a coupling portion in such a manner that they overlap each other, and in particular form an undercut. When the lid section and the housing section form an undercut, it is easily possible to achieve a fixed connection of the two components. In particular, in such cases, the housing section and the lid section can be locked to each other without using tools, e.g. by means of clips.

In general, it is feasible to create the coupling portion only in sections. Preferably, the coupling portion is designed to surround the circumference.

It is feasible to make the rear view means relatively mobile in relation to the housing section. This can be the case, for example, when the lid section and/or the housing section is created at least in sections from a flexible, pliable material, such as a plastic membrane. However, the rearview means may be locked relative to the housing section. In such cases, the rearview means can be set by adjusting the head section.

The rearview means can include a component which can be separated or is separated from the lid section. In such cases, the lid section can for example be adhered, or locked for example by spraying a reflective coating on the lid section. In one embodiment of the head section according to the invention, it is provided, however, that the lid section and the rearview means includes a single-piece component.

This makes it possible to reduce the number of components of the head section.

In general, it is feasible to create the lid section in a disc form. However, the lid section may be designed as a type of clamp, and includes a flat portion, which in particular includes the rearview means, and at least one edge portion which extends transverse or diagonally to the flat portion. In such cases, the lid section can be locked to the housing section like a clamp with the at least one edge section. The edge section can here be adjacent to the housing section from the inside, or grips the housing section from the outside.

The housing section and the lid section can be created from any material required. When the lid section and the rearview means include a combined single-piece component, i.e. when the rearview means is part of the lid section, it has been shown to be advantageous when the lid section includes a multiple-part component, wherein the flat portion includes a first lid part, in particular a plastic part, and the edge portion includes a second lid part, in particular a plastic part.

In general, it is feasible that the multiple-part component includes a dual-part plastic section. When the lid section has several functions, however, further plastic parts can be provided.

Due to the fact that the edge section can include another plastic part, such as the flat portion, the edge section can be designed to form a tight seal. The electronic unit can include a lighting unit for example. The light from the head section generated by the lamp can penetrate outwards through the light window. In such cases, the electronic unit can include a repeatedly flashing light or lighting for the area immediately surrounding a motor vehicle.

In an aspect, it is provided that the housing section includes a first housing part, in particular a plastic part, which lies directly on the hollow area and which has a coloring which is in particular essentially opaque and/or non-translucent, where the first housing part includes an opening in the area of the light window. Because the first housing component is opaque and non-translucent, an attractive appearance can be achieved. Because an opening is provided in the first housing part, the light from the electronic unit can penetrate outwards.

In order to prevent penetration by dirt or humidity, with a further development of the latter inventive embodiment, it is provided that an optical element, such as an optical fiber and/or light disc, can be arranged in and/or on the opening of the first housing part of the housing section and that a housing seal can be arranged or is arranged between the first housing part of the housing section and the optical element. Due to the provision of the housing seal between the optical element and the opening of the housing section, the hollow area is tightly sealed towards the outside. As a result, again, no separate housing is required for the electronic unit.

As a supplement or an alternative to the provision of a housing seal, it has been shown to be advantageous when a second housing part, in particular a plastic part, is arranged in such a manner that it lies on a surface of the first housing part which faces away from the hollow area, and is essentially translucent and/or transparent at least in the area of the light window, and in particular in the area of the light window is designed as an optical element such as an optical fiber and/or light disc.

Because a second housing part is adjacent to the first housing part, which in particular covers the opening provided in the first housing part towards the outside, no housing seal is required. Because the second housing part is translucent and/or transparent, light from the electronic unit which is designed as a lighting unit can penetrate outwards from the hollow area of the head section.

The rearview means can include a reflective means and/or a display means such as a screen, in particular an LED or LCD screen. When the display means includes a screen, the screen can be arranged on the flat portion of the lid section. It is furthermore feasible that the lid section, at least in the portion on which the LED or LCD screen is arranged, is arranged in a transparent and/or translucent manner, and the screen is arranged on the side of the flat portion of the lid section which faces towards the hollow area.

The electronic unit can include a setting facility for the rear view device. This makes it possible to set the rearview device in a simple manner. The setting facility can be arranged on the upper surface of the flat portion of the lid section which faces towards the hollow area.

The setting facility may include a setting unit with at least one lighting means which can be locked or is locked relative to a rear view means, and by means of which a directable or directed light beam can be emitted, which is at least almost solely perceivable in a specified operating position by a driver of a motor vehicle and/or a control unit. The lighting means can include a coiled wire bulb, an LED or a laser.

Due to the fact that the light beam can be detected at least almost solely in the specified operating position by a driver of a motor vehicle and/or by a control unit, the rearview means may be easy to adjust in a position which conforms to the regulations.

In order to enable light to exit, the housing section and/or the lid section, in particular the edge portion, may include a transparent and/or translucent area through which the light beam emitted by the lighting means can penetrate outwards at least almost unimpeded.

This makes it possible for light which is emitted by the lighting means to penetrate outwards from inside the rear view device and to be perceivable from the outside, where in the hollow area of the housing, it is at the same time protected against environmental influences.

The transparent and/or translucent area can in general be designed in any manner required. The transparent and/or translucent area may include a recess, in particular throughout, and/or a translucent and/or transparent material such as glass, in particular smoked glass, or plastic.

In general, it is feasible that the light beam emitted from the lighting means is sufficiently bundled in order to be perceivable almost solely in the specified operating position by the driver of a motor vehicle and/or the control unit. Furthermore, the setting unit may include at least one optical element which can be functionally assigned or is assigned to the lighting means, with which the light beam emitted by the lighting means can at least be bundled.

Furthermore, the object is attained by means of a rearview device, such as an internal or external mirror, for a motor vehicle with at least one head section, in particular with at least one of the features described above.

Finally, the object is attained by means of a motor vehicle with at least one rear view device with at least one of the features described above and/or with at least one head section, in particular with at least one of the features described above.

Because the lid section and the housing section surround a hollow area in an almost entirely sealing manner, electronic devices can be provided in the hollow area which require no housing. As a result, the head section and the rearview device can be compact in design.

The present invention also provides a plastic substrate coated with a decorative coating as described in U.S. patent application Ser. No. 15/124,310 and incorporated herein by reference in its entirety for all purposes, the decorative coating including a spectrally controlling system and a stress controlling system, the spectrally controlling system being multiple layers and optionally including a protective layer, and the stress controlling system being at least a single layer between the spectrally controlling system and the substrate, The multiple layers of the spectrally controlling system may be absorbing layers alternating with transparent layers, the optical thickness of the spectrally controlling system being selected such that the decorative coating achieves a desired optical effect, and at least one layer of the stress controlling system has a compressive stress of an amount such that the overall residual stress of the decorative coating is compressive when measured in the absence of the optional protective layer.

To understand the following description, it is important to understand what is herein meant by the phrase "desired optical effect" and the impact that the determination of the desired optical effect subsequently has upon how the decorative coating is spectrally tuned to provide the coated substrate with that desired optical effect.

The desired optical effect will be a desired appearance for a surface, or a part of a surface, of a product (when viewed from the front) that includes a coated substrate in accordance with the present invention. The desired optical effect will be made up of a combination of a desired transmitted color, a desired specular reflected color, and a desired diffuse reflected color, taking account of the combined influence of the decorative coating, the plastic substrate and the presence or not of backlighting. In this respect, the plastic substrate needs to be taken into account as the substrate may itself be tinted or clear, or may include embedded particles to provide the uncoated substrate with a hazy appearance, or may have one or both of its (uncoated) surfaces bearing a texture such as might be adopted to provide a "brushed-metal" appearance. While all of these attributes will contribute to the overall appearance of the final product, it should be appreciated that it is the decorative coating, and specifically the spectrally controlling system, that is tunable in the present invention to permit the achievement of the desired optical effect.

In relation to a determination of a desired transmitted color, a desired specular reflected color, and a desired diffuse reflected cp;pr, reference throughout this specification to a "color" is reference to a color that is defined by measured L*, a* and b* values in accordance with the 1976 CIE L*a*b* Space (or CIELAB) color model, which is an approximately uniform color scale organized in cube form. In the orthogonal a* and b* color axes, positive a* values are red, negative a* values are green, positive b* values are yellow and negative b* values are blue, while the vertical scale for lightness (or greyscale) L* runs from 0 (black) to 100 (white), allowing the positioning of a total color E in three points. The Chroma (C*) of the color is defined as (a*.sup.2+b*.sup.2), and is used to quantify the magnitude of the color independent of its lightness.

It will also be appreciated that reference to "transmitted" color and "reflected" color are references to the color of light after having been transmitted through an object ("transmitted color") or after having been reflected by the surface of an object ("reflected color"). Furthermore, with respect to reflected color, "specular reflection" is a reference to the mirror-like reflection of light from the surface of an object, in which light from a single incoming direction is reflected into a single outgoing direction, whereas "diffuse reflection" is of course a reference to incoming light being reflected in a broad range of directions.

The spectrally controlling system is thus ideally used to modify spectral reflection and transmission, so that the desired optical effect is achieved for the coated substrate. In particular, the optical thickness of the spectrally controlling system is selected such that the decorative coating achieves the desired optical effect. In one form, the magnitude of the spectral transmission is primarily controlled by the total optical thickness of the absorbing layers within the spectrally controlling system. However, both reflected and transmitted color is controlled by an interference effect between the absorbing and transparent layers within the spectrally controlling system. By controlling the optical thickness of all layers of the spectrally controlling system, including both the absorbing and transparent layers as necessary, this interference effect can be "tuned" so that the desired reflected and transmitted color can be achieved.

In a preferred form, the optical thicknesses are selected firstly to achieve the desired transmission, which is controlled by the combined optical thicknesses of the absorbing layers. Having established this target, the optical thickness of the transparent layers, and the ratio of the thickness of the individual absorbing layers, are further refined through the use of thin film modelling software (such as Tfcalc.TM.) to achieve a desired reflective color through an interference effect.

For example, a required product may need a gloss black appearance positioned in front of an illuminated display. This could be achieved via a decorative coating with low, neutral reflective color with negligible diffuse reflected color. This would present as a desired transmitted color of L*=44, a*=0, b*=0 and a desired specular reflected color of L*=25, a*=0, b*=0.

Taking this example further, using a CrZr alloy as an absorbing layer, a combined thickness of absorbing layers to achieve a % T of .about.14% might be .about.16.4 nm. To achieve the desired interference, a four layer stack could be used such that the combined thickness of the absorbing layers was split into two layers, 9.7 nm and 6.7 nm, the thicker layer deposited first. An SiO.sub.2 transparent layer can then be used to split the two absorbing layers, and a final SiO.sub.2 layer deposited on top of that. In this example, a spectrally controlling system including of CrZr/SiO.sub.2/CrZr/SiO.sub.2 is utilized, where the thickness of the SiO.sub.2 layers in combination with the CrZr layers is then optimized through a thin film modelling program to achieve the desired reflected color.

In this respect, it will be appreciated that "optical thickness" is a dimensionless measure of how much a given material retards the passage of light therethrough, derived from the multiplication of the complex refractive index and the distance travelled through the material by a light beam. It is also known as the optical path length. The complex refractive index is a number made up of a real part (defined as refractive index) and an imaginary part (defined as the extinction coefficient). It then will be appreciated that for any given layer of a material, the optical thickness (t) is defined as the material's refractive index (n) multiplied by the layer's physical thickness (d), normalized at the handled wavelength, for a refractive index at this wavelength. By way of example, optical thickness can thus be calculated using a refractive index at a wavelength of 550 nm. For example, chrome:$n_{550}$=3.17, having a physical thickness of 50 nm corresponds to an optical thickness of 0.288, while $SiO_2$:$n_{550}$=1.455, having a physical thickness of 100 nm corresponds to an optical thickness of 0.265.

It should also be appreciated that reference throughout this specification to an "absorbing layer" is a reference to a layer including a material, or a blend of materials, having a measured optical extinction coefficient greater than 1 in the spectral range of 400 to 1000 nm. Furthermore, it will be understood that reference to a "transparent layer" throughout this specification is a reference to a layer including a material, or a blend of materials, having a measured optical extinction coefficient of less than 1 in the spectral range of 400 to 1000 nm.

If utilized in the decorative coating of the present invention, a protective layer would be applied on top of the spectrally controlling system (and thus be an outermost layer) to provide enhanced abrasion resistance, fingerprint resistance and 'easy clean' functionality. Suitable materials for such a protective layer could be plasma polymerized hexamethyldisiloxane (HMDSO), fluoro polymer based coatings deposited via evaporation or liquid transfer techniques, or a liquid hardcoat applied via spin, dip, spray or flow coating techniques, with or without particulate additives for haze control (matt additive).

If a protective layer is used, it forms part of the spectrally controlling system (and thus part of the decorative coating) and as such its influence on the desired optical effect also needs to be accommodated, in the same manner as outlined above. Indeed, in the form of the invention where a protective layer is adopted, it would thus be the combined optical thickness of the protective layer plus the absorbing and transparent layers that would be selected such that the decorative coating achieved the desired optical effect.

For the absorbing layers of the spectrally controlling system, and as mentioned above, these are layers including a material, or a blend of materials, having a measured optical extinction coefficient greater than 1 in the spectral range of 400 to 1000 nm metals. Preferably, these materials are metals, metalloids, metal alloys or a mixture thereof that have a refractive index such that the sum of the refractive index and the extinction coefficient is greater than 2, while maintaining the extinction coefficient greater than 1. For the transparent layers of the spectrally controlling system, and again as mentioned above, these are layers including a material, or a blend of materials, having a measured optical extinction coefficient less than 1 in the spectral range of 400 to 1000 nm metals. Preferably, these materials are metals, metalloids, metal alloys (or a mixture thereof) that have a refractive index such that the sum of the refractive index and the extinction coefficient is less than 3, while maintaining the extinction coefficient less than 1.

In this form, the spectrally controlling system is an interference system made up of alternating layers of materials of different refractive indices, ideally with a relatively high refractive index contrast between adjacent layers. In this respect, such a refractive index contrast can be achieved by the selection of transparent layers of a material with a suitably low refractive index and absorbing layers of a material with a suitably high refractive index. In this respect, the difference in refractive index should be as high as possible to reduce overall film thicknesses required to produce the desired reflected color. It is desirable to have the low refractive index material of the lowest possible of practical materials.

With this in mind, suitable materials for the absorbing layers may be selected from the group of metals, metalloids and metal alloys including: chromium, aluminum, titanium, nickel, molybdenum, zirconium, tungsten, silicon, niobium, tantalum, vanadium, cobalt, manganese, silver, zinc, indium, germanium, tin and mixtures thereof; and an oxide, nitride, boride, fluoride or carbide thereof, and mixtures thereof. Most preferably, at least one layer is chromium, or a chromium mixture, such as Cr—Zr, Cr—Ni or Cr—Mo, or carbides or nitrides thereof, such as Cr—N.

Suitable materials for the transparent layers may be selected from the group of metals, metalloids and metal alloys including: boron, silicon, germanium, antimony, tellurium, polonium, niobium, zirconium, magnesium, tin, tantalum, aluminum, chromium, titanium and mixtures thereof; and an oxide, nitride, boride, fluoride or carbide thereof, and mixtures thereof. Most preferably, at least one layer is formed from an oxide such as $SiO_2$.

Preferred deposition methods that may be adopted for applying the multiple layers of the spectrally controlling system to the stress controlling system can also be chosen from any suitable vacuum vapor deposition systems, such as thermal evaporation, electron beam evaporation (with or without ion beam assistance) or sputter deposition. Sputter deposition is the preferred method. Additionally, the surface of the plastic substrate may first be subjected to a surface treatment to improve adhesion between the stress controlling system and the spectrally controlling system. The surface treatment may be selected from any of plasma discharge, corona discharge, glow discharge and UV radiation.

The preferred optical thickness of each individual layer of the spectrally controlling system will of course depend on the desired optical effect. Therefore, for each different product, the expectation is that there will be a different set of "preferred optical thicknesses". Noting this, in a spectrally controlling system that is a four layer stack, such as in the example provided above, it is envisaged that the first CrZr layer might have a preferred physical thickness in a range between 2 and 40 nm. The second layer might have a physical preferred thickness in a range between 20 and 200 nm. The second layer might have a more preferred physical thickness in the range between 48 and 101 nm. The third layer might have a preferred physical thickness in a range between 2 and 40 nm. The third layer might have a more preferred physical thickness in a range between 6.7 and 25 nm. The fourth layer might have a preferred physical thickness in a range between 15 and 200 nm. The forth layer might have a more preferred physical thickness in a range between 15 and 40 nm.

Turning now to a description of the stress controlling system, as mentioned above the stress controlling system ideally consists of one or more layers of a material that can ensure that the overall residual stress of the decorative coating will be compressive (when measured in the absence of an optional protective layer) but also that will be compatible with the plastic substrate. In this respect, a "compatible" layer will be one that displays good adhesion to the plastic substrate.

In this respect, in this stress range it has been found that a coated substrate will exhibit good performance throughout durability tests, such as salt spray, thermal shock, dry heat, immersion and humidity tests. Throughout this specification, this range will be referred to as "the desired stress window". Having said that, an alternative range for the desired stress window is less than −6 MPa, or less than −63 MPa, or less than −76 MPa, or less than −100 MPa, or less than −110 MPa, or less than −112, or less than 160 MPa. Furthermore, the lower bounds of the stress window may be −360 MPa or greater, −359 MPa or greater, −300 MPa or greater, −250 MPa or greater, or −200 MPa or greater. Further combinations of these ranges are also contemplated by the present invention. For example the stress window may be between 0 MPa to −300 MPa; −63 MPa to −300 MPa, −75 MPa to −300 MPa, −110 MPa to −300 MPa or 0 MPa to −250 MPa etc.

As mentioned above, the stress controlling system is ideally used to balance the overall residual stress of the decorative coating, such that the overall residual stress is maintained in the desired stress window. In this respect, when the combined optical thickness of the absorbing layers and the transparent layers (and of the protective layer, if present) are selected such that the spectrally controlling system provides the desired optical effect, the stress controlling system needs to include a layer of a compressive stress of a suitable amount so as to maintain the overall residual stress of the decorative coating in the desired stress window.

Preferred deposition methods that may be adopted for applying the one or more layers of the stress controlling system to the plastic substrate can be chosen from any vacuum vapour deposition system, such as thermal evaporation, electron beam evaporation (with or without ion beam assistance) or sputter deposition. Sputter deposition is the preferred method. Additionally, the surface of the substrate may first be subjected to a surface treatment to improve adhesion between the stress controlling system and the substrate. The surface treatment may be selected from any of plasma discharge, corona discharge, glow discharge and UV radiation.

In one form, the stress controlling system can be tuned to achieve the desired stress window by optimizing the deposition parameters of one or more of its layers. These parameters include sputter power, gas pressure, nitrogen gas doping and coating thickness. Stress can also be tuned to be more compressive (or less tensile) by introducing a thermal stress component by way of substrate heating, or by conducting a pretreatment process directly before the deposition of the stress controlling system. The interaction of the stress controlling system with the spectrally controlling system is complex and the tuning of the overall residual stress is ideally conducted with reference to the entire decorative coating being a complete coating 'stack'.

In this respect, the overall residual stress is the measured stress profile of the stress controlling system and spectrally controlling system (without the protective layer, even when such a protective layer will be utilized) as a complete stack deposited on a glass microscope cover slide. The stress measurement is obtained by placing the glass slide into a stress measurement device (such as a Sigma Physik SIG-500SP) before and after coating deposition.

Typically, there is little scope to tune the stress in the spectrally controlling system as the layers need to maintain near perfect (and consistent) composition to achieve the desired optical effect, meaning the resultant stresses in the spectrally controlling system tend not to be controllable and will be tensile or sometimes only slightly compressive. It is thus the stress controlling system that is tuned to bring the overall residual stress of the decorative coating into the desired stress window. If, for example, the spectrally controlling system is highly tensile, the stress controlling system will need to be compressive in stress and of a higher magnitude to achieve the desired stress window.

The stress controlling system will preferably be a single layer of a material which, when deposited, produces a high level of compressive stress. Materials known for their compressive stress are $SiO_x$, $SiO_xN_y$, $CrN_x$, $NbO_x$, $TaO_x$, and $ZrO_x$, where x and y are both preferably between 0.1 and 2.0.

The stress controlling system may be a multilayer system, which may be required when the preferred stress controlling layer is not compatible (displays poor adhesion) with the substrate. In this case, a compressive or slightly tensile compatible layer would be deposited on the substrate and then a highly compressive layer would be deposited on top. Examples of a multilayer system could be $CrN/Nb_2O_5$. It is envisaged that such a multilayer stress controlling system would obtain a highly compressive stress which is compatible with the substrate.

It will thus be apparent that when the desired optical effect is required to be altered to be another desired optical effect, such as by making different optical thickness selections for either or both of the absorbing layers and the transparent layers of the spectrally controlling system to give rise to a different color, concomitant changes will likely also be required for the stress controlling system to ensure that the overall residual stress of the decorative coating is maintained in the desired residual stress window.

The present application thus also provides a method for applying a decorative coating to a plastic substrate, the decorative coating providing the coated substrate with a desired optical effect, the decorative coating including a spectrally controlling system and a stress controlling system, the spectrally controlling system being multiple layers and optionally including a protective layer, and the stress controlling system being at least a single layer, wherein the multiple layers of the spectrally controlling system are absorbing layers alternating with transparent layers, the method including:
  a) determining the desired optical effect;
  b) determining a suitable spectrally controlling system that will provide the desired optical effect, with reference to a required optical thickness for the spectrally controlling system;
  c) determining a suitable stress controlling system that has a compressive stress of an amount such that the overall residual stress of the decorative coating compressive when measured in the absence of the optional protective layer;
  d) coating the suitable stress controlling system upon the plastic substrate;
  e) coating the suitable spectrally controlling system upon the stress controlling system; and
  f) thereby forming a coated plastic substrate with the desired optical effect.

The plastic substrate of the present invention may be formed from any suitable plastic material. For example, a plastic substrate may be formed from a material selected from the group including polyacrylate, polyester, polystyrene, polyethylene, polypropylene, polyamides, polyamides, polycarbonate, epoxy, phenolic, acrylonitrile-butadiene-styrene, acrylonitrile-styrene-acrylates, acetal and blends of these. Preferred plastic substrate materials include polycarbonate, poly (2,2'-dihydroxyphenylpropane) carbonate, polydiethyleneglycol bis(allyl carbonate), polymethylmethacrylate and polystyrene, or blends thereof. In preferred forms, the substrate will typically have a physical thickness in the range of 0.1 mm to 20 mm, more preferably in the range of 1 mm to 5 mm, and most preferably in the range of 2 mm to 3 mm.

A product bearing the decorative coating as described herein may also include other coatings either between the decorative coating and the substrate, within the decorative coating, such as the protective layer mentioned above that can optionally be a part of the spectrally controlling system of the decorative coating, or be upon the decorative coating. In particular, it is envisaged that in some embodiments it will be advantageous to include a hard coating between the decorative coating and the substrate. In this form, the hard coating is a protective layer which does not contribute to the overall desired optical effect, while in other embodiments an external protective layer upon the decorative coating will itself be a hard coating.

In this respect, a coating that is said to be a "hard coating" is a coating that is harder and stiffer than the substrate, whereby it increases the abrasion resistance of that substrate. Such an abrasion resistant hard coating is one that reduces damage due to impacts and scratching. Abrasion resistance can be measured through tests such as ASTM F735 "Standard Test Method for Abrasion Resistance of Transparent Plastics and Coatings Using the Oscillating Sand Method", ASTM D4060 "Standard Test Method for Abrasion Resistance of Organic Coatings", by the Taber Abrader, or by using the well-known Steelwool Test.

Furthermore, some plastic substrates can be damaged by certain solvents; for example, polycarbonate is damaged by acetone. It is a requirement for many products that might be suited to the decorative coating of the present invention that they be "chemically resistant", which is a reference to an ability to withstand exposure to normal solvents such as diesel fuel, petroleum, battery acid, brake fluid, antifreeze, acetone, alcohol, automatic transmission fluid, hydraulic oil and ammonia based window cleaners. In this respect, it will be appreciated that a hardcoating ideally provides a product bearing the decorative coating of the present invention with such chemical resistance.

A hard coating is preferably formed from one or more abrasion resistant layers, and may include a primer layer that bonds well to a plastic substrate and forms a preferable material for subsequent abrasion resistant layers. The primer layer may be provided by any suitable material and may for example be an organic resin such as an acrylic polymer, a copolymer of acrylic monomer and methacryloxysilane, or a copolymer of a methacrylic monomer and an acrylic monomer having a benzotriazole group or benzophenone group. These organic resins may be used alone or in combinations of two or more.

The abrasion resistant layers are preferably formed from one or more materials selected from the group consisting of an organo-silicon, an acrylic, a urethane, a melamine or an amorphous $SiO_xC_yH_2$. Most preferably, the abrasion resistant layer is an organo-silicon layer, due to its superior abrasion resistance and compatibility with physical vapour deposited films. For example, an abrasion resistant layer including an organo-silicon polymer can be formed by forming a layer of a compound selected from the following compounds by a method such as dip coating or the like and then curing the layer: trialkoxysilanes or triacyloxysilanes such as methyltrimethoxysilane, methyltriethoxysilane, methyltrimethoxyethoxysilane, methyltriacetoxysilane, methyltripropoxysilane, methyltributoxysilane, ethyltrimethoxysilane, ethyltriethoxysilane, vinyltrimethoxysilane, vinyltriethoxysilane, vinyltracetoxysilane, vinyltrimethoxyethoxysilane, phenyltrimethoxysilane, phenyltriethoxysilane, phenyltriacetoxysilane, gamma-chloropropyltrimethoxysilane, gamma-chloropropyltriethoxysilane, gamma-chloropropyltripropoxysilane, 3,3,3-trifluoropropyltrimethoxysilane gamma-glycidoxypropyltrimethoxysilane, gamma-glycidoxypropyltriethoxysilane, gamma-(beta-glycidoxyethoxy)propyltrimethoxysilane, beta-(3,4-epoxycyclohexyl)ethyltrimethoxysilane, beta-(3,4-epoxycyclohexyl)ethyltricthoxysilane, gamma-methacryloxypropyltrimethyoxysilane, gamma-aminopropyltrimethoxysilane, gamma-aminopropyltriethoxysilane, gamma-meraptopropyltrimethoxysilane, gamma-mercaptopropyltriethoxysilane, N-beta(aminocthyl)-gamma-aminopropyltrimethoxysilane, beta-cyanoethyltriethoxysilane and the like; as well as dialkoxysilanes or diacyloxysilanes such as dimethyldimethoxysilane, phenylmethyldimethoxysilane, dimethyldiethoxysilane, phenylmethyldiethoxysilane, gamma-glycidoxypropylmethyldimethoxysilane, gamma-glycidoxypropylmethyldiethoxysilane, gamma-glycidoxypropylphenyldimethoxysilane, gamma-glycidoxypropylphenyldiethoxysilane, gamma-chloropropylmethyldimethoxysilane, gamma-chloropropylmethyldiethoxysilane, dimethyldiacetoxysilane, gamma-methacryloxypropylmethyldimethoxysilane, gamma-metacryloxypropylmethyldiethoxysilane, gamma-mercaptopropylmethyldimethoxysilane, gamma-mercaptopropylmethyldiethoxysilane, gamma-aminopropylmethyldimethoxysilane, gamma-aminopropylmethyldicthoxysilane, methylvinyldimethoxysilane, methylvinyldiethoxysilane and the like.

The abrasion resistant layers may be coated onto a plastic substrate by dip coating in liquid followed by solvent evaporation, or by plasma enhanced chemical vapour deposition (PECVD) via a suitable monomer. Alternative deposition techniques such as flow coating and spray coating are also suitable. To improve the abrasion resistance of the hard coating, subsequent coatings of the abrasion resistant layer may be added, preferably within a 48 hour period to as to avoid aging and contamination of the earlier coatings.

The thickness of an abrasion resistant layer is preferably selected to assist in providing adequate abrasion resistance. In this respect, adequate abrasion resistance is regarded herein as being a Bayer abrasion ratio of 5 with respect to an uncoated plastic substrate (such as a polycarbonate), or alternatively by a Taber abrasion test with delta haze less than 15% after testing with a 500 g load and CS10F wheel at 500 cycles, (% haze being measured as per ASTM D1003). With these requirements met, when an organo-silicon is used as an abrasion resistant layer, the thickness of the hard coating is preferably in the range of from about 1 to about 15 microns, and is most preferably between 3 and 7 microns.

A refinement to the visual appearance can be achieved by patterning the substrate. For example, through the use of a patterned injection mold, a pattern can be formed on the front surface of a substrate. An example of a desirable optical effect is to replicate brushed stainless steel, and it has been found that parallel lines of random length (between 1 and 5 cm) positioned closely adjacent each other can achieve this appearance when subsequently coated with the present invention.

A further refinement to improve the visual comparison to brushed stainless steel is the incorporation of a matting additive to a hard coating protective layer which is applied to a patterned substrate. In this respect, it is known that a matt effect is achieved due to the uneven surface produced by the small (usually about.5.mu.m) particles of a matt additive. By alteration of the protective layer through the addition of matting additives to the hard coat, a "satin" appearance can also be achieved. This is characterized by a significant diffuse reflected component (Diffuse Reflection about between 10% and 30%, preferably 16% and a Specular Reflection of .about.8%).

In a further form of the present invention, the decorative coating may be overcoated with a protective layer to further enhance the abrasion resistance or to assist with the cleanability of the coated product. For example, a protective layer may be formed from a material exhibiting the following characteristics, including hydrophobic, hydrophilic, lipophobic, lipophilic and oleophobic characteristics or combinations thereof, and may include a hard coating (with or without a matting additive (particles)) such as that mentioned above.

In terms of possible uses for a decoratively coated plastic substrate in accordance with the present invention, as foreshadowed above the coated plastic substrates can be used as designer surfaces on a variety of consumer goods including premium automotive interior and exterior trim components, consumer and household goods, as well as fashionable household electronic products, and either as partial or full surfaces for those goods.

Also, the coated plastic substrates are able to provide illuminated patterns for products, sometimes referred to as "hidden 'til lit", and back lighting in general, in suitable situations. In this respect, a desired optical effect can be achieved by selecting the correct % R and % T such that a light can be shone through a coating to produce an illuminated pattern. However, when the rear illumination is not present, the visual appearance of the product is such that it appears uniform, such that there is no visible pattern present.

It is the also an object of the present invention to further develop the known external rear vision device to enhance functionality and efficiency while at the same time reducing size and costs as described in EP application number 16198759.9, which is incorporated herein by reference for all purposes.

This object is solved by a foot of the base assembly providing a spherical seat for a casing, in particular a lower casing element, of the head assembly, and frame means providing at least one spherical seat for the casing, with the frame means being rigidly attached to the fixed part or included by the fixed part.

According to the application, the base assembly can include an attachment part for the attachment to the motor vehicle, with the attachment part carrying a control system for or of the articulation assembly, and/or the attachment part guiding cables from the interior of the motor vehicles to the interior of the foot, and/or the attachment part closing the foot at its end opposite its spherical seat.

It is also proposed that the base assembly includes a carrier part for the attachment of the fixed part of the articulation assembly and/or of a fixation part of the frame means, with the carrier part extending from the spherical seat of the base assembly, and/or the carrier part guiding the cables from inside the foot through a cable exit into the head assembly.

Further, it is proposed with the invention that the carrier part is at least partly arranged within the fixation part, and/or the carrier part is attached to the fixation part by a screw or clip connection and/or by a bayonet attachment.

The frame means can includes a support part supporting the fixed part of the articulation assembly, preferably by at least partly encompassing the fixed part, with the support part in particular having a ring shape, and/or by a clips or snap connection.

Preferred embodiments are characterized in that the frame means includes a first spherical seat for the lower casing element and a second spherical seat for an upper casing element of the casing, with preferably the first and second spherical seats of the frame means being provided by extensions arranged at opposite ends of the fixation part and/or on the side of support part facing away from the fixed part of the articulation means.

With the invention it is proposed that the first spherical seat is provided by a first extension facing away from the fixed part of the articulation means and a second extension facing towards the moveable part of the articulation means, with preferably the support part and the first and second extensions form a part of a ring with a cut-out providing a rim facing towards the moveable part of the articulation means.

It is preferred that the fixation means is provided with a cable exit, with the cable exit of the fixation means being aligned with the cable exit of the carrier part, and/or the cable exit of the fixation means being arranged on the side of the fixation means facing away from the fixed part of the articulation means, and/or cables exiting the cable exit of the fixation means being connected to at least one camera and/or at least one light unit at least partly arranged within the head assembly.

Still further it is proposed with the invention that the lower casing element has a first spherical seat cooperating with the spherical seat of the foot and/or a second spherical seat cooperating with the first spherical seat of the frame means, with preferably the first and second spherical seats of the lower casing element being provided by a base part of the lower casing element.

The lower casing element preferably has an attachment part fixed to the moveable part of the articulation assembly, with preferably the attachment part extending substantially perpendicularly to the base part of the lower casing element, and/or preferably the attachment part and the frame means being arranged on opposite sides of the unit provided by the fixed and the moveable parts of the articulation means, and/or preferably the attachment part encompassing the moveable part at least partly, and/or preferably the attachment part and the moveable part being connected via a clips, plug and/or snap connection.

In addition, it is proposed that the attachment part is provided with a part ring for partly encompassing the moveable part of the articulation assembly, with preferably the part ring is provided by a cut-out determined by the part ring provided by the support part and the first and second extensions.

The unit can be an actuator for a reflective element, in particular in form of mirror element, being attached to the attachment part.

In addition, it is proposed that the lower casing element carries the upper casing element and/or the camera, and/or a bezel is attached to the lower and upper casing elements, with the bezel preferably surrounding the reflective element.

A head assembly of an external rear vision device, in particular in the form of a mirror head of an external rear view mirror, can be articulated inboard/outboard and up/down using an articulation means, in particular glass actuator, around a spherical joint, with spherical seats being provided between parts moving relative to each other such that they can rotate around two articulation axes perpendicular to each other having a common joint point. This ensures the maintenance of current end user functionality while offering significant smaller mirror size, with a reduction of size up to 30%. In addition, the unique layout of the internal mechanism with its spherical seats enhances packaging and performances.

The articulation assembly is also supported and protected for impact using the spherical seats, in particular due to the arrangement of frame means between the articulation assembly and a casing of the head assembly. The casing being assembled from several casing elements, one of which is secured to the moveable part of the articulation assembly, improves the weight distribution and reduces total housing frontal area on the vehicle which in turn improves aero performance and, thus, provides a higher fuel efficiency.

The pivot system used for the rear vision device of the invention with the single pivot point for two articulation axes permits a mirror adjustment movement while providing dynamic mirror performance and mirror impact support.

Further, as discussed in U.S. patent application Ser. No. 15/439,188, which is hereby incorporated by reference herein in its entirety for all purposes, in another aspect, a mirror assembly includes a mirror housing, a reflective element having a first field of view, a reflective coating having a second field of view, the second field of view being wider than the first field of view, and a multi-function backing plate supported by the mirror housing and including a reflective element supporting region where the reflective element is supported by the multi-function backing plate and a reflective coating supporting region where the reflective coating is applied to the backing plate.

The reflective coating supporting region may be convex so that the reflective coating is convex and provide a wider field of view.

The reflective element supporting region may include an aperture for receiving the reflective element, and the reflective coating supporting region may be thicker than the reflective element supporting region.

The reflective coating may be a chromium-based reflective coating.

In another aspect, the present description relates to a backing plate or a polymeric substrate, wherein the backing plate or polymeric substrate is coated with a reflective coating such as a chromium-based reflective coating.

The present description also provides the chromium-based reflective coating for a backing plate or a polymeric substrate, wherein the coating is an alloy of chromium and a dopant material, the dopant material being selected from the hexagonally close-packed transition metals, the alloy having a crystal structure of a primary body-centered cubic phase in coexistence with a secondary omega hexagonally close-packed phase. In a preferred form of the present invention, the alloy is a binary alloy of chromium and the dopant material.

The present description also provides a method of forming a chromium-based reflective coating on a backing plate or a polymeric substrate, the method including applying chromium and a dopant material to the polymeric substrate by physical vapour deposition, the dopant material being selected from the hexagonally close-packed transition metals, to form an alloy coating, the alloy coating being applied so as to have a crystal structure of a primary body-centered cubic phase in coexistence with a secondary omega hexagonally close-packed phase. In a preferred form of the present invention, the alloy is applied so as to be a binary alloy of chromium and the dopant material.

In one embodiment, the at least one light element is arranged on one side of the polymeric substrate, and wherein the polymeric substrate and the chromium-based reflective coating are at least in part permeable to light originating from the at least one light element.

The polymeric substrate may be used in different technical fields, such as in automotive industry, advertising industry or any industry which provides products having a protective coating that does also provide light reflective as well as light transmission properties.

The chromium-based reflective coating may be based on an alloy including chromium. Chromium is a Group 6 member of the transition metals and has a body-centered cubic (bcc) crystal structure. Incorporated as the primary component in the preferred binary alloy of the present invention, being an alloy of two principal metallic components, chromium is used primarily for its contribution towards producing a shiny, hard surface that is resistant to corrosion, thus bringing to the alloy the desirable property of optical reflectivity, preferably with an R % greater than 50% so as to find acceptable use in forming a mirror. It has a high melting point, a stable crystalline structure and moderate thermal expansion, making it an ideal primary component for use in the harsh environmental conditions described above.

The secondary component of the preferred binary alloy is the dopant material mentioned above, the dopant material herein often being referred to as M and being selected from the hexagonally close-packed (hcp) transition metals. The hcp structure is the most common among the transition metals, including the transition metals zirconium (Zr), titanium (Ti), cobalt (Co), hafnium (Hf), rubidium (Ru), yttrium (Y), and osmium (Os). In this respect, some of these hcp transition metals, such as Zr, Ti and Co are practically easier materials to work with and so will be preferred dopant materials for the purposes of the present invention.

While it is envisaged that Zr will be the most preferred hcp dopant material, and thus the present invention will be described herein mainly with reference to Zr as the hcp dopant material, this should not be regarded as a limitation on the scope of the present invention.

In a preferred form of the present invention, the alloy will be a binary alloy and the atomic percentage of the dopant material in the binary alloy will be in the range of from about 1.9 at. % to about 5.8 at %. However, within this broad range, there may be narrower ranges that relate to specific dopant materials, as will be described further below.

It has been found that the introduction of small amounts of a hcp dopant material to the chromium (a bcc transition metal) can yield a range of alloy compositions having an intermetallic crystal structure that has bcc and omega-hcp phases coexisting, which has been found to provide those alloys with further advantageous properties (beyond those of chromium alone). Indeed, it has been found that the careful selection of the amount of hcp dopant material relative to the amount of chromium can give rise to alloy compositions within those ranges that are particularly preferred, where desirable properties (such as abrasion resistance) are maximized and undesirable properties (such as a color other than a neutral color) are minimized.

By way of explanation, it has been found that coatings according to the present invention change in phase composition as the elemental composition of the dopant material is increased, from bcc only, to bcc plus omega-hcp, to bcc plus an amorphous phase. The optical and mechanical properties observed for the coatings show variation commensurate with these changes in composition, with the preferred optical and mechanical properties occurring when the phase composition is bcc plus omega-hcp. Without wishing to be bound by theory, it is believed that the observed changes are due to the changing electron structure of the atoms and the crystallographic conformation relative to each other.

Specifically, when the phase composition was bcc plus omega-hcp, the crystal structure of the coatings demonstrated d-orbital transitions which gave rise to neutral color and relatively lower reflectivity, with the well-ordered crystal structure yielding higher relative resistance to abrasion. By way of comparison, when the amorphous phase was present, the d-orbital transitions were no longer observed, indicating that the orbital hybridization between neighbouring atoms was partially filling the d-orbitals, correlating with a less-preferred lower reflectivity. Furthermore, the lower atomic packing density in such an amorphous phase was found to yield coatings with reduced resistance to abrasion, which of course is also less desirable.

With this in mind, and referring to the dopant material as M in the general formula CrMx, this transition of phase from bcc plus omega-hcp, to bcc plus an amorphous phase, was found to occur at values of x of about 0.06, correlating to about 5.8 at. %, when the dopant material was Zr. The same transition is expected to occur at about the same value of x also for Ti and Co.

Unlike the reflectivity, the color of the coatings of the present invention was found to not show a change in trend at the transition of the phase from bcc plus omega-hcp, to bcc plus an amorphous phase. To the contrary, at the transition of the phase from bcc to bcc plus omega-hcp, which was found to occur for Zr at values of x (in the above general formula) of about 0.05 (correlating to a lower limit of about 4.5 at. %), a transition in the color of the coatings of the present invention was found. This suggests the onset of the orbital hybridization in the electron structure occurs at concentrations of Zr as the dopant material close to about 4.5 at. %. However, the same transition point for Co as the dopant material was found to be about 1.9 at. %.

By way of explanation, and again using Zr as the exemplary hcp dopant material, at low concentrations there is an increase in the resistance to abrasion upon increasing the elemental composition of Zr. A maximum in the resistance to abrasion is observed at the transition from bcc to the bcc plus omega-hep, after which increasing the Zr concentration leads to a steady decrease in the measured abrasion ratio. Indeed, from an electron diffraction analysis of CrZrx coatings, two transition concentrations are defined that represent the change from one phase composition to another. For Zr as the dopant material, these transitions are at about x=0.05 (bcc to bcc+Ω-hcp) and about 0.06 (bcc+Ω-hcp to bcc+ amorphous). In this respect, the omega-hcp phase is understood to be a displacive phase transformation from the bcc structure.

Accordingly, in one example, the alloy will be a binary alloy and the dopant material will be Zr, wherein the atomic percentage of the dopant material in the binary alloy will be in the range of from about 4.5 at. % to about 5.8 at. %.

In yet another form, the alloy will be a binary alloy and the dopant material will be Co, wherein the atomic percentage of the dopant material in the binary alloy will be in the range of from about 1.9 at. % to about 5.7 at. %. In relation to predictive conclusions able to be drawn by the inventors (based on the similarity in the physical nature of all hcp transition metals) from the experimental work (described below) conducted in relation to Zr and Co, and to an extent Ti, it will be appreciated by a skilled addressee that the behaviour of the other hcp transition metals as the dopant material in the present invention can be reasonably expected to be the same or similar to that as seen with Zr, Co and Ti. Indeed, the comparative experimental work conducted (again, see below) on the bcc transition metal molybdenum (Mo), where similar behavior was not expected (and was not seen) due to the different physical nature of this transition metal, also tends to confirm these predictive conclusions about the hcp transition metals.

Indeed, given that the physical nature of the other hcp transition metals is similar to both Zr and Co, it is expected that Ti, Hf, Ru, Y and Os will display the same structure forming abilities in the Cr based alloy of the present invention when their concentration is within the range of about 1.9 at. % to about 5.8 at. %.

The coatings may preferably be ultrathin coatings, wherein the thickness is selected to achieve the desired optical property, such as transmission and/or reflectivity. For example, the coating is being defined in this specification to be a coating with a thickness of 200 nm or less. In one embodiment, the coating has a thickness of 100 nm. It is envisaged that preferred thicknesses will be in the range of 100 nm or less, or more preferably in the range of 40 nm to 80 nm, or more preferably in the narrower range of 50 nm to 70 nm. Ideally, the thickness will be about 60 nm.

Preferably, the inventive polymeric substrate is formed by injection compression moulding, although any other method known in the art, such as compression moulding, blow moulding, reaction moulding and sheet casting, could also be utilised and thus also falls within the scope of the present invention.

The polymeric substrate may be any known type of polymeric substrate material and for example could be a substrate formed from a material selected from the group including polyacrylate, polyester, polystyrene, polyethylene, polypropylene, polyamides, polyamides, polycarbonate, epoxy, phenolic, acrylonitrile-butadiene-styrene, acrylonitrile-styrene-arylates, acetal and blends of these. Preferred substrate materials include polycarbonate, poly (2,2'-dihydroxyphenylpropane) carbonate, polydiethyleneglycol bis (allyl carbonate), polymethylmethacrylate and polystyrene, or blends thereof.

The polymeric substrate or the backing plate bearing the coating of the present invention may also include other coatings (pre-coatings) either between the coating and the substrate, within the coating, or as an outer layer. In particular, it is envisaged that in some embodiments it will be advantageous to include a hardcoating between the coating and the substrate or as an outer coating. In this form, the hardcoating is a protective layer which does not contribute to the overall desired optical effect, while in other embodiments an external protective layer upon the decorative coating will itself be a hard coating.

In this respect, a coating that is said to be a "hard coating" is a coating that is harder and stiffer than the substrate, whereby it increases the abrasion resistance of that substrate. Examples for hard coats are, but not limited to, organosilicon, an acrylic, a urethane, a melamine or an amorphous $SiO_xC_yH_z$. Such an abrasion resistant hard coating is one that reduces damage due to impacts and scratching. Abrasion resistance can be measured through tests such as ASTM F735 "Standard Test Method for Abrasion Resistance of Transparent Plastics and Coatings Using the Oscillating Sand Method", ASTM 04060 "Standard Test Method for Abrasion Resistance of Organic Coatings", by the Taber Abrader, or by using the well-known Steelwool Test.

The abrasion resistant layers are preferably formed from one or more materials selected from the group consisting of an organo-silicon, an acrylic, a urethane, a melamine or an amorphous SiOxCyHz. Most preferably, the abrasion resistant layer is an organo-silicon layer, due to its superior abrasion resistance and compatibility with physical vapor deposited films. For example, an abrasion resistant layer including an organo-silicon polymer can be formed by forming a layer of a compound selected from the following compounds by a method such as dip coating or the like and then curing the layer: trialkoxysilanes or triacyloxysilanes such as methyltrimethoxysilane, methyltriethoxysilane, methyltrimethoxyethoxysilane, methyltriacetoxysilane, methyltripropoxysilane, methyltributoxysilane, ethyltrimethoxysilane, ethyltriethoxysilane, vinyltrimethoxysilane, vinyltricthoxysilane, vinyltracetoxysilane, vinyltrimethoxyethoxysilane, phenyltrimethoxysilane, phenyltriethoxysilane, phenyltriacetoxysilane, gamma-chloropropyltrimethoxysilane, gamma-chloropropyltriethoxysilane, gamma-chloropropyltripropoxysilane, 3,3,3-trifluoropropyltrimethoxysilane gamma-glycidoxypropyltrimethoxysilane, gammaglycidoxypropyltriethoxysilane, gamma-(beta-glycidoxyethoxy)propyltrimethoxysilane, beta-(3,4-epoxycyclohexyl)ethyltrimethoxysilane, beta-(3,4-epoxycyclohexyl) ethyltriethoxysilane, gamma-methacryloxypropyltrimethyoxysilane, gamma-aminopropyltrimethoxysilane, gamma-aminopropyltricthoxysilane, gammameraptopropyltrimethoxysilane, gamma-mercaptopropyltriethoxysilane, Nbeta(aminoethyl)-gamma-aminopropyltrimethoxysilane, betacyanoethyltriethoxysilane and the like; as well as dialkoxysilanes or diacyloxysilanes such as dimethyldimethoxysilane, phenylmethyldimethoxysilane, dimethyldiethoxysilane, phenylmethyldiethoxysilane, gammaglycidoxypropylmethyldimethoxysilane, gamma-glycidoxypropylmethyldiethoxysilane, gamma-glycidoxypropylphenyldimethoxysilane, gammaglycidoxypropylphenyldiethoxysilane, gamma-chloropropylmethyldimethoxysilane, gamma-chloropropylmethyldiethoxysilane, dimethyldiacetoxysilane, gammamethacryloxypropylmethyldimethoxysilane, gammametacryloxypropylmethyldiethoxysilane, gammamercaptopropylmethyldimethoxysilane, gamma-mercaptopropylmethyldiethoxysilane, gamma-aminopropylmethyldimethoxysilane, gammaaminopropylmethyldiethoxysilane, methylvinyldimethoxysilane, methylvinyldiethoxysilane and the like.

The pre-coated films may also include, inorganic oxides (silica, titania, alumina), thin metal films (Cr, etc), where the pre-coated substrate has been prepared to have the desirable surface energy, residual stress, thermal coefficient of expansion, conductivity, chemical functionality, etc, as required by the specific application of such a Cr based alloy coating.

In a similar manner, a skilled addressee will understand that an overcoating may be applied over the coating of the present invention, which overcoating could include transparent coatings for the purposes of mechanical strength, wettability, optical interference filters, modified coefficient of friction, etc. The overcoating may be the above hardcoating or any other protective layer. Such protective layer(s) provide enhanced abrasion resistance, fingerprint resistance and 'easy clean' functionality. Suitable materials for such a protective layer could be plasma polymerised hexamethyldisiloxane (HMDSO), fluoro polymer based coatings deposited via evaporation or liquid transfer techniques, or a liquid hardcoat applied via spin, dip, spray or flow coating techniques, with or without particulate additives for haze control (matt additive). In one embodiment, in case the polymeric substrate is used as a housing of a rear view device, the overcoating is permeable to light from the light element and may have the same color as the rest of the rear view device and the vehicle. In one embodiment the color may be different to the rest of the vehicle.

In a preferred form, the physical vapor deposition techniques adopted in the method of the present invention will be based upon magnetron sputtering, be it from a primary alloy target or using a co-sputtering process involving two targets made from the respective components of the alloy. Alternatively, it will be appreciated that the preferred alloy could be deposited using thermal evaporation or e-beam evaporation of the respective alloy components.

It should be appreciated that, due to the nature of polymeric substrates, conventional temperature processing (during or after deposition) could generally not be employed to modify the properties of alloy coatings of the type of the present invention, although this finally depends on the polymeric material of the polymeric substrate. In the inventive coatings, the inventors have determined that the preferred alloys change in phase composition as the elemental composition of a dopant material (such as Zr, Ti or Co) is increased; from bcc only, to bcc plus $\Omega$-hcp, to bcc plus an amorphous phase. The optical and mechanical properties for these preferred alloys (as ultrathin coatings) show variation commensurate with the composition and observed changes relate to the changing electron structure of the atoms and the crystallographic conformation relative to each other.

Indeed, these crystalline ultrathin coatings demonstrate d-orbital transitions that give rise to neutral color and relatively lower reflectivity, with a well-ordered crystal structure yielding higher relative resistance to abrasion. When amorphous material is present in the coatings, the d-orbital transitions are no longer observed, indicating the partial filling of the d-orbitals. It is believed that the orbital hybridization between neighbouring atoms partially fills the d-orbitals, correlating with a yellow color and higher reflectivity. Furthermore, the lower atomic packing density in the amorphous phase yielded coatings with reduced resistance to abrasion.

It should be appreciated that many different coating compounds are described throughout the present description and that the present invention is not limited to such coatings. For example, a coated backing plate in accordance with the present description may be coated by any type of reflective coating not limited to the coatings described herein.

REFERENCE SIGN LIST 100 rearview device
110 housing
115 painted part
120 rearview element
130 bezel
130A, 130B, 130C, 130D different positions or zones
140 LED light strip
150 diffuser 200 lighting assembly
210 connector
220 PCB board
230 LED
240 lenses
250 filter
260 external housing
600 flexible circuit
610 lighting elements
610a first light
610b second light
610c third light
610d forth light
610e fifth light
620 connector controlling unit
630 flexible heater pad or ribbon circuit
700 rearview device
710 connector
720 bezel
740 receiving portion
750 glass reflector
800 flexible circuit
810 lighting elements
820 electrical connector
830 heater pad
840 temperature sensor
850 communication module
900 rearview device
910 connector
920 bezel
940 light receiving portion
950 glass reflector

What is claimed is:

1. An external rearview device for a vehicle, comprising:
a rearview element comprising at least one of a reflective element, a camera, or a display element;
a housing configured to be attached to the vehicle and configured to be moveable relative to the vehicle;
a bezel affixed to an opening defined by the housing and surrounding the rearview element; and
wherein the bezel is coated and a coating of the bezel is at least one of a decorative coating, an advanced surface technology, or a spectrally controlling system; and
wherein the rearview element is coupled to at least one of the bezel or the housing.

2. The external rearview device of claim 1, further comprising a foot configured to be fixed to the vehicle and relative to which the housing and bezel is moveable.

3. The external rearview device of claim 1, wherein the bezel is made of a polymeric substrate and the coating comprises a spectrally controlling system.

4. The external rearview device of claim 3, wherein an optical thickness of the spectrally controlling system is selected to provide spectral reflection and transmission for a desired optical effect.

5. The external rearview device of claim 4, wherein the coating provides a metallic appearance to the bezel.

6. The external rearview device of claim 5, wherein the coating is a chrome-based coating.

7. The external rearview device of claim 1, wherein the bezel defines an interior space; and
at least one of a light assembly and an electronic means are configured to be at least partly disposed within the interior space of the bezel.

8. The external rearview device of claim 7, wherein the electronic means is connected to at least one of the light assembly, the display element, an actuator, a sensor, the camera, a heater, or a wiper.

9. The external rearview device of claim 1, wherein the coating of the bezel is a chromium-based coating; and
the chromium-based coating is an alloy of chromium and a dopant material, the dopant material being selected from hexagonally close-packed transition metals, the alloy having a crystal structure of a primary body-centered cubic phase in coexistence with a secondary omega hexagonally close-packed phase.

10. The external rearview device of claim 7, wherein the light assembly is at least partially disposed within the bezel and is hidden until lit.

11. The external rearview device of claim 7, wherein the light assembly includes at least one of a printed circuit board, a light emitting diode, an integrated lens, self-charging illuminating material, a flexible circuit board, a bulb, a lamp, or a diffuser.

12. The external rearview device of claim 11, wherein the light assembly is configured to provide a light function indication, and wherein the light function indication is at least one or more of a direction indicator, an approach light, a strong braking signal, an emergency braking signal, a logo light, a puddle light, a Human Machine Interface (HMI), a Blind Spot Indicator (BSI), charging indicator status, a vehicle mode, a sports mode, an economy mode, an autonomous drive mode, a sleep mode, a vehicle locked, a vehicle stolen, a warning signal, a temperature indicator, a weather indicator, a traffic light signal, a fuel status, an emergency vehicle indication, a vehicle communication, a handshake, a connection indicator, a hazard lights side marker indication, or a parking light indicator.

13. The external rearview device of claim 7, comprising only one light assembly configured to direct a light with different characteristics to different positions of the bezel for providing different light function indications wherein the light assembly is configured to direct light to different positions of the bezel.

14. The external rearview device of claim 7, comprising a plurality of light assemblies,
wherein each light assembly is configured to direct light with a light characteristic to a region of the bezel to provide a light function indication,
wherein each light assembly is different according to the region and the light characteristic for each light assembly,
wherein the light characteristic is determined by at least one of a light color, a light intensity or a light pulse length, and
wherein the region of the bezel is one of a lower region, an inner region, an outer region, or an upper region of the bezel above the rearview element.

15. The external rearview device of claim 7, wherein each light assembly is configured to be directly affixed to portion of the bezel thereby eliminating a need for a printed circuit board.

16. The external rearview device of claim 7, wherein each light assembly is configured to be coupled to a portion of the bezel through one of a surface mount, an overmold, a conductive material, or a printed material thereby eliminating a need for a printed circuit board.

17. The external rearview device of claim 7, wherein at least one of a conductor track, the electronic means or the light assembly is configured to be directly affixed to the bezel by at least one of an injection molding (MID) process, a conductive foil (IML), or a laser direct structuring (LDS).

18. The external rearview device of claim 7, wherein the light assembly further comprises:
at least one light source unit having at least one wire;
a housing unit configured to support the at least one light source unit and having a connecting means configured to connect the at least one light source unit to a power source; and
a sealing means;
wherein the at least one light source includes at least one of an LED light, a light tape, a printed lighting, an optical light guide, a lamp, an illuminating charging material, a charging cell, a solar powered cell, or a battery, and
wherein the at least one light source, the housing unit and the sealing means are arranged in a way that eliminates a need for a printed circuit board.

19. The external rearview device of claim 7, wherein the light assembly is configured to direct a plurality of different color lights to an entire surface of the bezel so that the entire bezel can have one color at a time, and wherein the light assembly is configured to provide a plurality of different color lights to different zones of the bezel so that different zones of the bezel can have different colors at a time.

20. The external rearview device of claim 15, wherein the plurality of light assemblies are configured to direct a plurality of different color lights to an entire surface of the bezel so that the entire bezel can have one color at a time, and wherein the plurality of light assemblies are also configured to provide a plurality of different color lights to different regions of the bezel so that different regions of the bezel display different colors.

21. The external rearview device of claim 1, wherein the housing, the reflective element, and the bezel are integrally formed so that the device is sealed from an outside environment to protect against dust, water, or humidity.

22. The external rearview device of claim 7, further comprising:
a light diffuser positioned within the interior space of the bezel.

23. The external rearview device of claim 22, wherein the light diffuser is disposed between a light source and the bezel.

24. The external rearview device of claim 23, wherein the light diffuser has a shape that is configured to dispose the light diffuser against inner surfaces of the rearview element and the bezel.

25. The external rearview device of claim 1, wherein the housing comprises an upper part and a lower part wherein the bezel is attached to both the upper part and the lower part.

26. The external rearview device of claim 1, wherein, the bezel is secured, glued, removably attached, or clipped to the housing.

27. The external rearview device of claim 1, further comprising:
a connection to a control unit of the vehicle wherein the control unit of the vehicle is configured to control at least one of the one or more light assemblies, the display element, an actuator, a camera controller, or a cleaning device through the connection.

28. The external rearview device of claim 1, further comprising:
a sensor wherein an output of the sensor controls at least one of the light assembly, a display, or an actuator,
wherein the sensor is one of a camera or a light sensor for controlling multiple light intensities or light brightness.

29. The external rearview device of claim 1, further comprising
a flexible circuit having a light element, the light elements configured to be directly attached to the flexible circuit.

30. The external rearview device of claim 29, wherein the flexible circuit further comprises:
a single connector controlling unit configured to control the one or more light elements and to receive an external connector;
an integrated heating pad configured to heat the rearview element;
an integrated temperature sensor; and
at least one of an integrated communication unit or an antenna;
wherein the integrated communication unit is one of a WiFi communication unit or a Bluetooth communication unit.

31. The external rearview device of claim 29, wherein
the one or more light elements are at least two light elements which are configured to project different colored lights for providing different functions; and
the one or more light elements are at least four light elements which are configured to project different colored lights for providing different functions.

32. The external rearview device of claim 31, wherein
the different functions provided comprise logo light, Human Machine Interface (HMI), charging indicator status, vehicle mode, sports mode, economy mode, autonomous drive mode, sleep mode, vehicle locked, vehicle stolen, warning signals, temperature or weather indicator, traffic light signal, fuel status, emergency indications for emergency vehicles including a police vehicle, doctor vehicle, ambulance, or traffic maintenance, vehicle communication, handshake, connection indicator, hazard lights, or a parking light indication.

* * * * *